(12) United States Patent
Batchelder

(10) Patent No.: US 9,183,960 B2
(45) Date of Patent: Nov. 10, 2015

(54) BETAVOLTAIC POWER CONVERTER DIE STACKING

(75) Inventor: Geoffrey D. Batchelder, Chandler, AZ (US)

(73) Assignee: Medtronic, Inc., Minneapolis, MN (US)

( * ) Notice: Subject to any disclaimer, the term of this patent is extended or adjusted under 35 U.S.C. 154(b) by 1020 days.

(21) Appl. No.: 12/790,334

(22) Filed: May 28, 2010

(65) Prior Publication Data

US 2011/0291210 A1    Dec. 1, 2011

(51) Int. Cl.
| | | |
|---|---|---|
| H01L 31/115 | (2006.01) | |
| H01L 21/00 | (2006.01) | |
| G21H 1/00 | (2006.01) | |
| G21H 1/06 | (2006.01) | |
| H01L 27/146 | (2006.01) | |

(52) U.S. Cl.
CPC ............ *G21H 1/06* (2013.01); *H01L 27/14659* (2013.01); *H01L 31/115* (2013.01)

(58) Field of Classification Search
None
See application file for complete search history.

(56) References Cited

U.S. PATENT DOCUMENTS

| | | | |
|---|---|---|---|
| 2,819,414 | A | 1/1958 | Sherwood et al. |
| 3,706,893 | A | 12/1972 | Olsen et al. |
| 3,836,798 | A * | 9/1974 | Greatbatch ............ 310/303 |
| 5,087,533 | A | 2/1992 | Brown |
| 5,260,621 | A | 11/1993 | Little et al. |
| 6,238,812 | B1 | 5/2001 | Brown et al. |
| 6,479,919 | B1 | 11/2002 | Aselage et al. |
| 6,911,711 | B1 * | 6/2005 | Shimabukuro et al. ....... 257/429 |
| 7,663,288 | B2 | 2/2010 | Chandrashekhar et al. |
| 2007/0273244 | A1 | 11/2007 | Lal et al. |
| 2011/0241144 | A1 | 10/2011 | Spencer et al. |
| 2011/0291210 | A1 | 12/2011 | Batchelder |
| 2012/0186637 | A1 | 7/2012 | Batchelder |

FOREIGN PATENT DOCUMENTS

| | | |
|---|---|---|
| DE | 1055144 B | 4/1959 |
| EP | 1958928 A1 | 8/2008 |

OTHER PUBLICATIONS

Prutchi, "Nuclear Peacemakers," 2005, 8 pp., available at http://www.prutchi.com/pdf/implantable/nuclear_peacemakers.pdf.
Applicant points out that the year of publication is sufficiently earlier than the effective U.S. filing date and any foreign priority date so that the particular month of publication is not in issue and, therefore, no month is required per MPEP 609.04(a)(l).

(Continued)

*Primary Examiner* — Fernando L Toledo
*Assistant Examiner* — Valerie N Newton
(74) *Attorney, Agent, or Firm* — Evans M. Mburu

(57) ABSTRACT

A power converter comprises a first die and a second die. Each die comprises a semiconductor substrate comprising a junction for converting nuclear radiation particles to electrical energy, the junction of each semiconductor substrate comprising a first side and a second side, a first electrode comprising a nuclear radiation-emitting radioisotope deposited on the semiconductor substrate, the first electrode being electrically connected to the first side of the junction, and a second electrode deposited on the semiconductor substrate, the second electrode being electrically connected to the second side. A bond is formed between one of the first electrode or the second electrode of the first die and one of the first electrode or the second electrode of the second die, wherein the bond forms an electrical contact between the bonded electrodes.

37 Claims, 13 Drawing Sheets

(56) References Cited

OTHER PUBLICATIONS

Blanchard, et al., A Nuclear Microbattery for MEMS Devices, University of Wisconsin Madison, Final Scientific Technical Report. Jan. 2002, 10 pps.

Wacharasindhu et al., Liquid-Semiconductor-Based Micro Power Source Using Radioisotope Energy Conversion; Transducers 2009, Denver, CO, USA, Jun. 21-25, 2009; pp. 656-659.

Prutchi, Nuclear Pacemakers, 2005, 8 pp. viewable at www.prutchi.com.

Silicon Carbide—Boron High Aspect Ratio Pillared Betavoltaic Cell Technology Brief, Cornell University Center for Technology, Enterprise and Commercialization, 2005, 2 pp.

Tulenko et al., Final Technical Annual Report Project Period: Sep. 1, 2006-Aug. 31, 2007, Robotics Technology Development Program, University of Florida, College of Engineering, 2007, pp. 1-46.

Ulmen et al., Development of Diode Junction Nuclear Battery Using 63Ni, Journal of Radioanal Nucl. Chem. (2009) 282: pp. 601-604, Published online: Aug. 1, 2009.

Chandrashekhar, Demonstration of a 4H SiC Betavoltaic Cell: A Dissertation Presented to the Faculty of the Graduate School of Cornell University, Jan. 2007, 123 pp.

Honsberg et al., GaN Betavoltaic Energy Converters, Presented at 31st IEEE Photovoltaics Specialist Conference, Orlando, Florida, Jan. 3-7, 2005, 4 pp.

U.S. Appl. No. 60/711,139, filed Aug. 25, 2005, 56 pp.

Duggirala et al., "3D Silicon Betavoltaics Microfabricated using a Self-Aligned Process for 5 Milliwatt/CC Average, 5 Year Lifetime Microbatteries," The 14th International Conference on Solid-State Sensors, Actuators and Microsystems, Lyon, France, Jun. 10-14, 2007, pp. 279-282.

Liu et al., "Betavoltaics using scandium tritide and contact potential difference," Applied Physics Letters, AIP, american Institute of Physics, vol. 92, No. 8, Feb. 29, 2008, pp. 083511-1-083511-3.

International Search Report and Written Opinion of PCT/US2011/034577, dated Jul. 19, 2011, 13 pp.

International Preliminary Report on Patentability form corresponding PCT Application Serial No. PCT/US2011/034577 dated Dec. 13, 2012 (9 pages).

Office Action from U.S. Appl. No. 13/286,865, dated May 1, 2014, 12 pp.

US 5,829,484, 1/1999, Mannik et al. (withdrawn).

Notice of Allowance from U.S. Appl. No. 13/286,865, dated Dec. 16, 2014, 9 pp.

Final Office Action from U.S. Appl. No. 13/286,865, dated Sep. 29, 2014, 14 pp.

Response to Office Action mailed May 1, 2014, from U.S. Appl. No. 13/286,865, filed Sep. 2, 2014, 9 pp.

Notice of Allowance from U.S. Appl. No. 13/286,865, dated Dec. 16, 2014, 9 pp.

\* cited by examiner

BETAVOLTAIC POWER CONVERTER DIE STACKING

TECHNICAL FIELD

The invention relates to betavoltaic power cells.

BACKGROUND

Betavoltaic devices convert energy from a radioactive source that emits beta particles (high-energy electrons). A betavoltaic device converts the energy of the beta particles to electrical current by collecting electron-hole pairs that are formed by beta particles incident upon a semiconductor material of the betavoltaic device.

SUMMARY

In general, the present disclosure is directed to a power converter comprising a plurality of stacked dice and a method of making the same, wherein each die comprises a nuclear radition-emitting electrode and a junction for converting beta particles into electrical energy.

In one example, the disclosure is directed to a betavoltaic power converter comprising a first die comprising a semiconductor substrate comprising a junction for converting nuclear radiation particles to electrical energy, the junction comprising a first side and a second side, a first electrode comprising a nuclear radiation-emitting radioisotope deposited on the semiconductor substrate, the first electrode being electrically connected to the first side of the junction, and a second electrode deposited on the semiconductor substrate, the second electrode being electrically connected to the second side of the junction. The power converter also comprises a second die comprising a semiconductor substrate comprising a junction for converting nuclear radiation particles to electrical energy, the junction of the second die comprising a first side and a second side, a first electrode comprising a nuclear radiation-emitting radioisotope deposited on the semiconductor substrate of the second die, the first electrode of the second die being electrically connected to the first side of the junction of the second die, and a second electrode deposited on the semiconductor substrate of the second die, the second electrode being electrically connected to the second side of the junction of the second die. A bond is formed between one of the first electrode or the second electrode of the first die and one of the first electrode or the second electrode of the second die, wherein the bond forms an electrical contact between the bonded electrodes.

In another example, the disclosure is directed to a method of making a betavoltaic power converter, the method comprising forming a first semiconductor substrate comprising a junction, the junction comprising a first side and a second side, depositing a first electrode comprising a nuclear radiation-emitting radioisotope on the first semiconductor substrate and forming an electrical connection between the first electrode and the first side, depositing a second electrode on the first semiconductor substrate and forming an electrical connection between the second electrode and the second side, forming a second semiconductor substrate comprising a junction, the junction comprising a first side and a second side, depositing a third electrode comprising a nuclear radiation-emitting radioisotope on the second semiconductor substrate and forming an electrical connection between the third electrode and the first side of the junction of the second semiconductor substrate, depositing a fourth electrode onto the second semiconductor substrate and forming an electrical connection between the fourth electrode and the second side of the junction of the second semiconductor substrate, and mechanically coupling and electrically connecting either the first electrode or the second electrode to either the third electrode or the fourth electrode.

The details of one or more examples are set forth in the accompanying drawings and the description below. Other features, objects, and advantages of the disclosure will be apparent from the description and drawings, and from the claims.

DETAILED DESCRIPTION

Figure 1A:
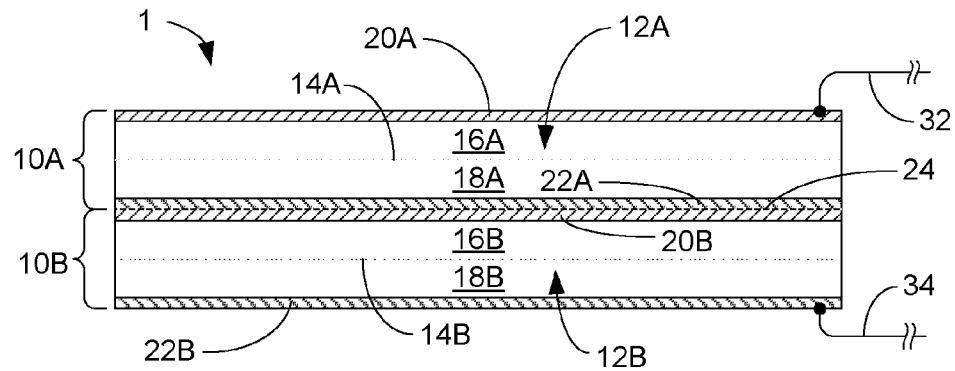
FIGS. 1A-1D are schematic diagrams of example betavoltaic power converters.

In general, this disclosure is directed to a power converter for the conversion of nuclear energy, such as alpha particles or beta particles, to electrical energy. The power converter stacks individual power converter dice in order to adjust the output voltage and current capacity from the betavoltaic converter. Stacking of the individual power converter dice also allows the power converter to have a smaller volume for the same power output, allowing the power converter to be used as a power source for small devices such as implantable sensor devices.

Each die of the power converter includes a material that emits nuclear radiation particles that are converted to electrical current by the power converter. The nuclear radiation-emitting material may emit alpha particles (a nuclear particle comprising two protons and two neutrons that is identical to the nucleus of a helium atom) via alpha decay or beta particle (a high-energy electron) via beta decay. Although the power converter as described in the present disclosure can convert both alpha and beta radiation to electrical current, the disclosure will focus on a power converter for converting beta particles into electrical current, generally referred to as a betavoltaic power converter.

FIGS. 1A-1D are schematic views of several example betavoltaic power converters 1, 2, 3, 4, in accordance with this disclosure. The example betavoltaic power converters 1, 2, 3, 4 each comprise a first betavoltaic die 10A and a second betavoltaic die 10B. First die 10A comprises a semiconductor substrate 12A comprising a junction 14A having a first side 16A and a second side 18A. In one example, junction 14A comprises a P-N junction within semiconductor substrate 12A, wherein first side 16A is either a P side or an N side of the P-N junction and second side 18A is the other of the P side or the N side. A first electrode 20A and a second electrode 22A are deposited on semiconductor substrate 12A. First electrode 20A comprises a beta-emitting radioisotope in order to emit beta particles toward junction 14A. In one example, both first electrode 20A and second electrode 22A comprise a beta-emitting radioisotope. First electrode 20A is electrically connected to first side 16A, which may be the P side or N side of a P-N junction, while second electrode 22A is electrically connected to second side 18A, which may be the other side of a P-N junction. In the examples shown in FIGS. 1A-1D, first side 16A is the P side 16A and second side 18A is the N side 18A of a P-N junction 14A so that first electrode 20A is electrically connected to P side 16A while second electrode 22A is electrically connected to N side 18A such that first electrode 20A acts as the cathode of first die 10A and second electrode 22A acts as anode of first die 10A. In one example, the electrical contact between electrodes 20A, 22A and regions 16A, 18A respectively is by the electrode being deposited directly on the region 16A, 18A and forming an ohmic contact. In another example, described in more detail below, a seed metal is deposited onto semiconductor substrate 12A to form an electrical contact between regions 16A and 18A, and electrodes 20A, 22A are deposited onto the seed metal. The beta-emitting radioisotope is a material that undergoes beta decay to emit beta particles. P-N junction 14A converts beta particles into electrical current by collecting electron-hole pairs that are formed in semiconductor substrate 12A by beta particles incident on semiconductor substrate 12A, described in more detail below.

Second die 10B is configured to be similar to first die 10A such that second die 10B also comprises a semiconductor substrate 12B comprising a junction 14B having a first side 16B and a second side 18B. In one example, junction 14B comprises a P-N junction within semiconductor substrate 12B, wherein first side 16B is either a P side or an N side of the P-N junction and second side 18A is the other of the P side or the N side. A first electrode 20A comprising a beta-emitting radioisotope and a second electrode 22B are deposited on semiconductor substrate 12B of second die 10B. In one example, both first electrode 20B and second electrode 22B comprise a beta-emitting radioisotope. First electrode 20B is electrically connected to first side 16B, which may be either the P side or N side of a P-N junction, while second electrode 22B is electrically connected to second side 18B, which may be the other side of a P-N junction. In the examples shown in FIGS. 1A-1D, first side 16B is the P side 16B and second side 18B is the N side 18B of a P-N junction 14B so that first electrode 20B is electrically connected to P side 16B while second electrode 22B is electrically connected to N side 18B such that first electrode 20B acts as the cathode of second die 10B and second electrode 22B acts as anode of second die 10B. In one example, first electrode 20B is electrically connected to the same type of region as first electrode 20A of first die 10A (e.g., either both to the P side or both to the N side) and second electrode 22B is electrically connected to the same type of region as second electrode 22A. For example, if first electrode 20A of first die 10A is electrically connected to P side 16A and second electrode 22A is electrically connected to N side 18A of P-N junction 14A, as shown in the examples of FIGS. 1A-1D, then first electrode 20B is electrically connected to P side 16B and second electrode 22B is electrically connected to N side 18B of semiconductor substrate 12B. Like first die 10A, the beta-emitting radioisotope of second die 10B is a material that emits beta particles, while P-N junction 14B of second die 10B converts the beta particles into electric current by collecting electron-hole pairs generated by the beta particles.

Junction 14A, 14B of each die 10A, 10B provides for the conversion of beta particles incident on semiconductor substrate 12A, 12B from the beta-emitting radioisotope of first electrode 20A, 20B. If second electrode 22A, 22B also comprises a beta-emitting radioisotope, then beta particles emitted from second electrode 22A, 22B may also be converted by junction 14A, 14B. As described in more detail below, beta particles form electron-hole pairs in the semiconductor material of semiconductor substrate 12A, 12B, which are collected by junction 14A, 14B in order to provide a flow of electrons from the power converter. As described below, the electron-hole pairs are collected because of the close proximity of the P side and N side that forms each junction 14A, 14B. The terms "P side" or "p type" as it is used in this disclosure refers to a material that provides for excess holes to act as positive, or "p type," mobile charge carriers. The terms "N side" or "n type" as it is used in this disclosure refers to a material that provides for excess electrons to act as negative, or "n type," mobile charge carriers.

Junction 14A, 14B may be any semiconductor junction that provides for the collection of electron-hole pairs. In one example, junction 14A, 14B comprises a P-N junction formed within semiconductor substrate 12A, 12B, wherein P side 16A, 16B is formed by a p type region within semiconductor substrate 12A, 12B and N side 18A, 18B is formed by an n type region within semiconductor substrate 12A, 12B. The close proximity of the p type region and the n type region causes an electric field to develop at junction 14A, 14B that sweeps electrons in one direction and holes in the other (described in more detail below), providing for an electric current when the power converter is connected to a circuit.

In another example, the junction that provides for conversion of beta particles comprises a Schottky-barrier junction formed between semiconductor substrate 12A, 12B and a metal layer (not shown). Depending on the type of metal used to form the Schottky-barrier junction, the semiconductor material of semiconductor substrate 12A, 12B adjacent to the metal layer may be doped to be an n type semiconductor or a p type semiconductor. If semiconductor substrate 12A, 12B is doped with a p type dopant, then the semiconductor region of the Schottky-barrier junction forms P side of the junction, which may form the first side or the second side of the junction, while the metal layer applied to the P side semiconductor surface creates the Schottky-barrier at the semiconductor-metal interface, which forms the other of the first side or the second side. If semiconductor substrate 12A, 12B is doped with an n type dopant, then the semiconductor region of the Schottky-barrier junction forms N side of the junction, which may form the first side or the second side of the junction, while the metal layer applied to the N side semiconductor surface creates the Schottky-barrier at the semiconductor-metal interface, which forms the other of the first side or the second side. A work function difference between the metal layer and the doped semiconductor provides an electric field, similar to the field created in a P-N junction that provides for the collection of electron-hole pairs. In one example, non-beta emitting electrode, 22A, 22B is electrically connected to the semiconductor region of the Schottky-barrier junction, while the beta emitting electrode 20A, 20B, is electrically connected to the metal layer of the Schottky-barrier junction.

Although junction 14A, 14B may be formed by any structure that provides for the collection of electron-hole pairs formed by beta particles incident on semiconductor substrate 12A, 12B, the remainder of the present disclosure will focus on the example of a P-N junction. Therefore, junction 14A, 14B, as well as other junctions throughout the present disclosure, is referred to as "P-N junction." In addition, because the P side of a P-N junction is formed by a p type region of semiconductor substrate 12A, 12B, P side 16A, 16B, as well as other P sides throughout the present disclosure, is referred to as "p type region 16A, 16B." Similarly, because the N side of a P-N junction is formed by an n type region of semiconductor substrate 12A, 12B, N side 18A, 18B, as well as other N sides throughout the present disclosure, is referred to as "n type region 18A, 18B." However, the use of terms describing junction 14A, 14B, or any other junction, as a P-N junction are not meant to be limiting. For example, a Schottky-barrier junction may be used instead of a P-N junction without varying from the scope of the present disclosure.

A bond is formed between first die 10A and second die 10B. The bond forms between one of first electrode 20A or second electrode 22A of first die 10A and one of first electrode 20B and second electrode 22B of second die 10B. As described in more detail below, the exact configuration of which electrode 20A, 22A of first die 10A is bonded to which electrode 20B, 22B of second die 10B depends on the arrangement of electrodes 20A, 22A, 20B, 22B, e.g., which electrodes are anodes and which are cathodes, and on whether it is desired to form a series or parallel arrangement of first die 10A and second die 10B. The bond between first die 10A and second die 10B forms an electrical contact between the bonded electrodes.

Example bonding arrangements between first die 10A and second die 10B are shown in FIGS. 1A-1D. For the purposes of simplicity, for each example of FIGS. 1A-1D, first electrodes 20A, 20B will be described as the cathode for each die 10A, 10B while second electrodes 22A, 22B will be described as the anode for each die 10A, 10B. However, the anode-cathode arrangement of either die 10A, 10B or both dice 10A, 10B may be reversed, such as by reversing the placement of p type region 16A, 16B and n type region 18A, 18B (e.g., reversing the electrodes of first die 10A such that first electrode 20A is the anode and second electrode 22A is the cathode of first die 10A, reversing the electrodes of second die 10B such that first electrode 20B is the anode and second electrode 22B is the cathode of second die 10B, or reversing the electrodes of both first die 10A and second die 10B).

FIG. 1A is a schematic view of an example power converter 1 wherein anode 22A of first die 10A is bonded and electrically connected to cathode 20B of second die 10B via bond 24 such that first die 10A and second die 10B are connected in series. Electrodes 20A and 22B are then connected to a load, such as the circuitry of an implantable sensor device. In one example, connection wire 32 is connected to cathode 20A of first die 10A and connection wire 34 is connected to anode 22B of second die 10B such that cathode 20A and wire 32 become the cathode of power converter 1 formed by bonded dice 10A, 10B and anode 22B and wire 34 become the anode of power converter 1.

Figure 1B:
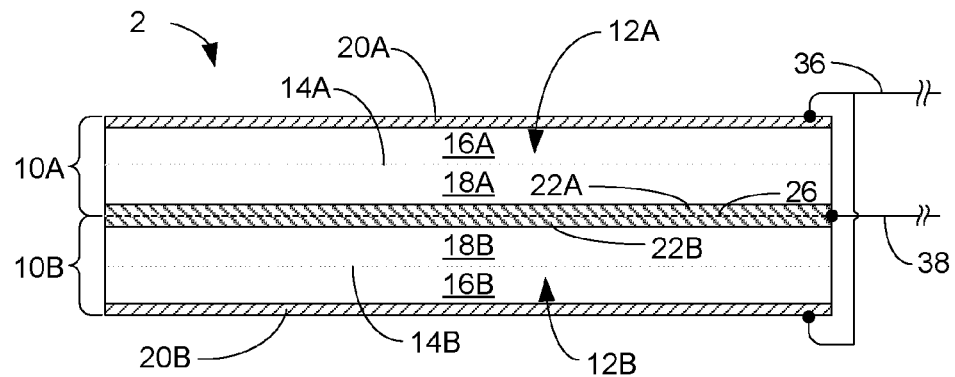

FIG. 1B is a schematic view of an example power converter 2 wherein anode 22A of first die 10A is bonded and electrically connected to anode 22B of second die via bond 26 such that first die 10A and second die 10B are connected in parallel. Cathodes 20A and 20B are connected together to one side of the load while anodes 22A and 22B are connected to the other side of the load. In one example, connection wire 36 is connected to both cathodes 20A, 20B and connection wire 38 is connected to one or both of anodes 22A, 22B, such that wire 36 acts as the cathode for power converter 2 and wire 38 acts as the anode for power converter 2.

Figure 1C:
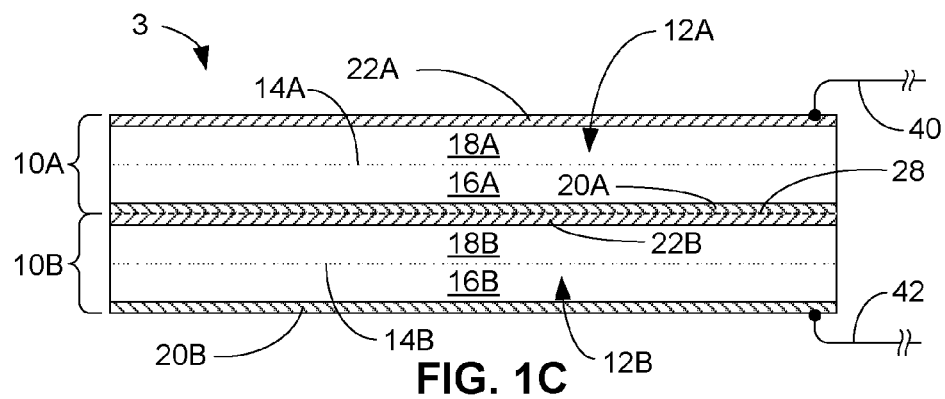

FIG. 1C is a schematic view of an example power converter 3 wherein cathode 20A of first die 10A is bonded and electrically connected to anode 22B of second die 10B via bond 28 such that first die 10A and second die 10B are connected in series. Electrodes 22A and 20B are then connected to a load, such as via connection wires 40 and 42, such that cathode 20B and wire 42 become the cathode of power converter 3 and anode 22A and wire 40 become the anode of power converter 3. Thus, the example power converter 3 of FIG. 1C is functionally identical to the example power converter 1 of FIG. 1A with the electrical polarity reversed.

Figure 1D:
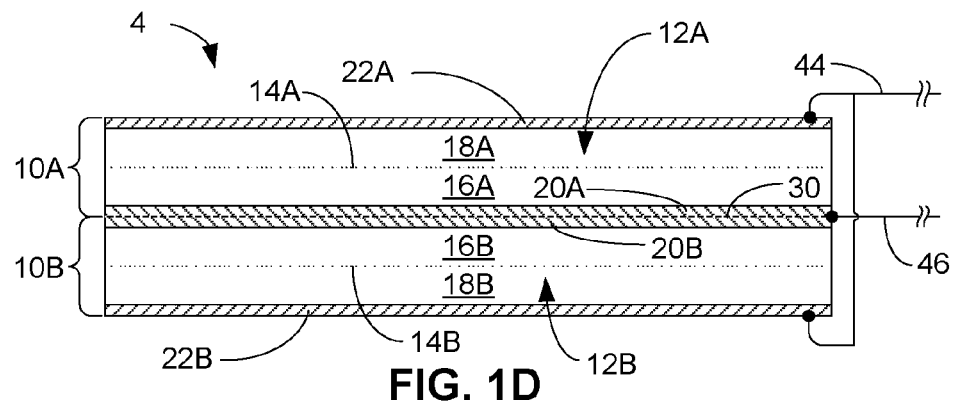

FIG. 1D is a schematic view of an example power converter 4 wherein cathode 20A of first die 10A is bonded and electrically connected to cathode 20B of second die 10B via bond 30 such that first die 10A and second die 10B are connected in parallel. Anodes 22A and 22B are connected together to one side of the load while cathodes 20A and 20B are connected to the other side of the load, such as via connection wires 44 and 46, respectively. In the example shown in FIG. 1D, wire 44 acts as the anode for power converter 4 and wire 46 acts as the cathode for power converter 4. Thus, the example power converter 4 of FIG. 1D is functionally identical to the example power converter 2 of FIG. 1B with the electrical polarity reversed.

The bond between first die 10A and second die 10B, such as bonds 24, 26, 28, 30 in FIGS. 1A-1D, provides a mechanical coupling between the bonded electrodes of dice 10A and 10B as well as an electrical connection between the bonded electrodes. Bond 24, 26, 28, 30 may provide for both the mechanical coupling and electrical connection by itself. In one example, bond 24, 26, 28, 30 may be via welding wherein an electrically conductive material is melted to produce a molten weld pool that is cooled to provide bond 24, 26, 28, 30 between the bonded electrodes. In one example, one or both of the bonded electrodes may be melted by an energy source to provide the molten weld pool that forms bond 24, 26, 28, 30. In another example, a separate work piece may be melted onto one or both of the bonded electrodes to form the molten weld pool that is allowed to cool to form bond 24, 26, 28, 30 between the bonded electrodes. Whichever method is used, the material that is used to form the molten weld pool must be compatible with the material of each of the bonded electrodes so that the molten weld pool properly wets the surfaces of the bonded electrodes so that the final bond 24, 26, 28, 30 adheres to both bonded electrodes. In one example, molten welding is used when the bonded electrodes are made from the same material, such as an example wherein cathode 20A of first die 10A is bonded to cathode 20B of second die 10B (FIG. 1D) and wherein both cathodes 20A and 20B are made from the same material. Other welding techniques may also be used, such as laser beam welding or electron beam welding.

In one example, bond 24, 26, 28, 30 comprises a solid-state bond between the bonded electrodes. In one example, bond 24, 26, 28, 30 is a diffusion bond, also referred to as a diffusion weld, between the bonded electrodes formed by pressing the bonded electrodes together under an applied pressure at an elevated temperature, such as between about 30% and about 80% of the absolute melting point (in degrees Kelvin) of the material of the bonded electrodes, such as between about 35% and about 65% of the absolute melting point, for a period of time between about one minute to about 5 hours, such as between about 1 hour and about 4 hours, for example between about 2 hours and about 3 hours. The elevated temperature and pressure provides for the formation of a bond at the atomic level by providing for intimate contact of the mating surfaces due to local plastic deformation of the materials of the bonded electrodes that aids interdiffusion at the surface layers of the electrodes. In one example, wherein the bonded electrodes each comprise the beta-emitting radioisotope nickel-63, a diffusion bond may be formed by exerting a pressure of between about $1.5 \times 10^6$ Newtons per square meter and about $7 \times 10^7$ Newtons per square meter, at a temperature of between about 400° C. and about 600° C., for a time period of between about 1 minute and about 3 hours. In one example, wherein the bonded electrodes comprise the beta-emitting radioisotope nickel-63, a solid-state diffusion bond was formed by applying a pressure of about $1.6 \times 10^6$ Newtons per square meter, at a temperature of about 450° C. (about 723° K, or about 42% of the absolute melting point of nickel), for about 3 hours. Nickel-to-Nickel diffusion bonding is discussed in further detail in Christenson et al., A *Batch Wafer Scale LIGA Assembly and Packaging Technique Via Diffusion Bonding*, Proc. of 12th IEEE Int'l Conf. on Microelectromechanical Systems, pp. 476-81 (1998), the disclosure of which is incorporated herein by reference in its entirety.

A solid-state diffusion bond may be particularly advantageous when bonding a beta-emitting electrode 20A of first die 10A with a beta-emitting electrode 20B of second die 10B. This is so because beta particles are self absorbed in the source electrode layer and because beta particles have a limited penetration depth. For this reason, a beta-emitting electrode 20A, 20B will have an optimum thickness wherein the increased number of beta particles that can be produced by beta-emitting electrode 20A, 20B is counteracted by the increased self absorption of beta particles within beta-emitting electrode 20A, 20B as well as the decreased penetration range into the semiconductor substrate. In one example, beta-emitting electrode 20A of first die 10A and beta-emitting electrode 20B of second die 10B may each have a thickness of approximately half of the optimum thickness and may be diffusion bonded or laser welded together to form a single beta-emitting layer having the optimum thickness without any foreign material at the bond interface. In this way, approximately half as much beta-emitting material may be needed to provide the same energy-producing effect.

Bond 24, 26, 28, 30 may also be formed by an adhesive that is applied between the bonded electrodes, such as the electrically conductive epoxy ABLEBOND 84-1LMI from Ablestik Laboratories, a subsidiary of National Starch & Chemical Co., Rancho Dominguez, Calif., with one or more electrical conduction pathways that are formed between the bonded electrodes. The conduction pathway(s) may be entrained or encased within the adhesive, or the conduction pathway(s) and adhesive may be arranged in a pattern between the bonded electrodes. In one example, the conduction pathway may be one or more wires that are formed between the bonded electrodes and that are held in place by the adhesive. In another example, bond 24, 26, 28, 30 may comprise an adhesive with a conductive filler, such as flakes or powder comprising a conductive material such as silver, nickel, copper, or graphite, wherein the adhesive provides for mechanical coupling between the bonded electrodes and the conductive filler provides the electrical conduction pathway.

As described above, the first electrode 20A, 20B of each die 10A, 10B comprises a beta-emitting radioisotope that emits beta particles as part of beta decay of the radioisotope. Beta particles emitted by first electrode 20A, 20B enter semiconductor substrate 12A, 12B, where some of the beta particles lose energy to the semiconductor material of the semiconductor substrate. If the energy transferred from the beta particles to the semiconductor is sufficient, it will excite electrons within the semiconductor crystal lattice into the conduction band of semiconductor substrate 12A, 12B, creating electron-hole pairs within the lattice. As described below, P-N junction 14A, 14B is configured to collect the electron-hole pairs to create electrical current.

Examples of materials that may be used as the beta-emitting radioisotope of first electrode 20A, 20B of each dice 10A, 10B include nickel-63 ($^{63}$Ni, half life ~100.1 years), promethium-147 ($^{147}$Pm, half life ~), and tritium ($^3$H, half life ~12.3 years), and compounds of each, such as scandium tritide (e.g. a scandium hydride, ScH$_2$, wherein an appreciable percentage of the hydrogen atoms are tritium). Other examples of beta-emitting radioisotopes that may be useful in first electrodes 20A, 20B include strontium-90 ($^{90}$Sr, half-life ~27.7 years) that decays to another beta-emitting isotope yttrium-90 ($^{90}$Y, half life of only about 64 hours), and thalium-204 ($^{204}$Tl, half life of ~3.75 years), and compounds of each. The type of beta-emitting material that may be used in betavoltaic power converters according to the present disclosure depend on the application for which the power converter is designed. For example, although strontium-90 and thalium-204 provide for higher-energy beta decay, they also provide for the possibility of Bremsstrahlung radiation (x-rays) resulting from the deceleration of the beta electrons. In addition, the yttrium-90 that forms from the decay of strontium-90 may produce some low level of gamma radiation. In addition, when the beta particle energy is above about 140 keV, crystal damage may begin to accrue in the semiconductor substrate. Half life considerations may need to be traded-off against the source activity which is a function of how pure a source material is available. In addition, processes that permit the fabrication of a device using the source material are also necessary. For these reasons, strontium-90 and thalium-204 may not be desirable for devices that are implantable in the body without proper shielding, which may be expensive and/or impractical.

The beta-emitting radioisotope that is used in first electrode 20A, 20B may depend on the desired power output, the energy available from the beta-emitting radioisotope, and longevity of the power converter. Different beta-emitting radioisotopes have different beta ray energy distributions, maximum energy outputs, and specific activities as well as different half lives and specific activity. The primary parameters of interest are the amount of power and the power density that the device can produce over a given time period. The specific activity, related to the rate at which a given mass of material decays, is also a relevant factor. The half life is the amount of time it will take for half of the beta-emitting radioisotope to have decayed via beta decay. In one example, a beta-emitting radioisotope may be considered useful or sufficient for about 1 to about 2 half lives of the material of the radioisotope, after which, too much of the radioisotope will have decayed such that it no longer produces enough beta particles. Materials with shorter half lives will require more beta-emitting material to be included in electrode 20A in order to meet a desired end of life specification, such as a 20 year end of life specification desired for implantable medical devices. Table 1 below shows the maximum energy output, $E_{Max}$, and the approximate half life, $t_{1/2}$, for various beta-emitting radioisotopes.

| Radioisotope | $E_{Max.}$ (MeV) | $E_{Avg.}$ (MeV) | Specific Activity (GBq/g) | $T_{1/2}$ (years) |
|---|---|---|---|---|
| $^3$H | 0.018 | 0.006 | 357,000 | 12.3 |
| $^{63}$Ni | 0.067 | 0.0174 | 2190 | 100.1 |
| $^{147}$Pm | 0.225 | 0.062 | 34,800 | 2.6 |
| $^{90}$Sr/$^{90}$Y | 0.545/2.26 | 0.196/0.93 | 5050 | 28.8/(64 hours) |
| $^{204}$Tl | 0.764 | 0.243 | | 3.8 |

Figure 2A:
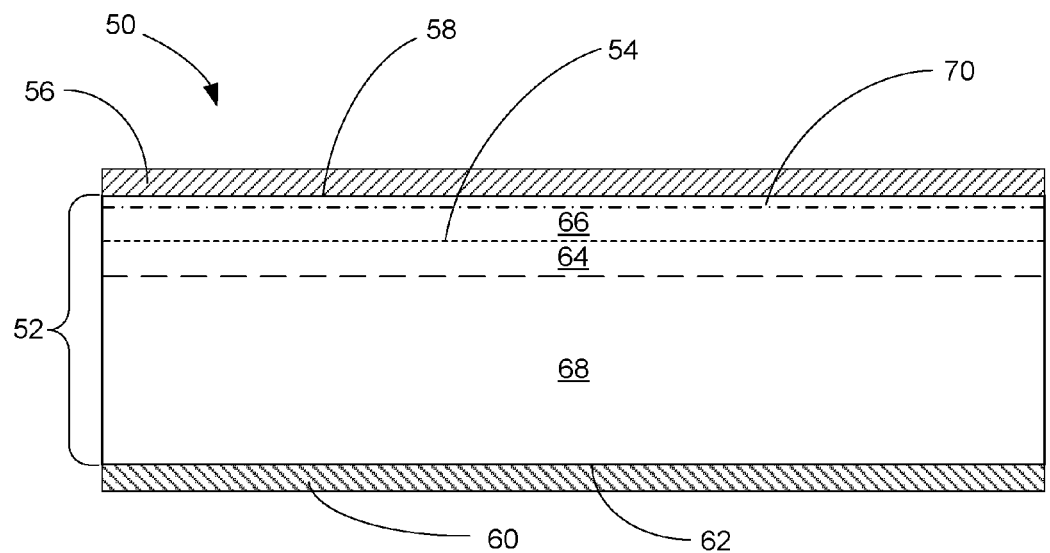
FIGS. 2A-2B are schematic diagrams of example dice for use in a betavoltaic power converter.

Semiconductor substrate 12A, 12B comprises a semiconductor structure that is configured to collect electron-hole pairs that are formed by beta particles incident on semiconductor substrate 12A, 12B. As described above with respect to FIGS. 1A-1D, in one example, each semiconductor substrate 12A, 12B comprises a P-N junction 14A, 14B in order to collect electron-hole pairs (described below). FIG. 2A shows an example die 50 comprising a semiconductor substrate 52 that forms a P-N junction 54 for the collection of electron-pairs created from beta particles incident on semiconductor substrate 52. As with dice 10A, 10B described above with respect to FIGS. 1A-1D, die 50 may also comprise a first electrode 56 that is deposited on semiconductor substrate 52 and that is electrically connected to either the p type region or the n type region of P-N junction 54 and a second electrode 60 deposited on semiconductor substrate 52 that is electrically connected to the other region of P-N junction 54. First electrode 56 corresponds to first electrode 20A, 20B of FIGS. 1A-1D and second electrode 60 corresponds to second electrode 22A, 22B of FIGS. 1A-1D. First electrode 56 may comprise a beta-emitting radioisotope, such as the beta-emitting radioisotopes described above with respect to first electrodes 20A, 20B. Beta particles are absorbed readily into most materials, including the materials of electrode 56 and semiconductor substrate 52. Therefore, in one example, P-N junction 54 is positioned as close as is practical to the beta-emitting radioisotope, that is, P-N junction 54 is positioned as close as is practical to first electrode 56. P-N junction 54 is positioned close to the beta-emitting radioisotope of first electrode 56 by configuring the layer(s) on the P side of the P-N junction 54 to be as thin as is practical while still providing a sufficient thickness for the depletion zone to form around P-N junction 54. In one example, semiconductor substrate 52 is configured so that P-N junction 54 is positioned proximate first electrode 56, such as within about 10 microns from first electrode 56, for example within about 5 microns of first electrode 56, such as within about 3 microns of first electrode 56. In one example, P-N junction 54 is between about 0.5 microns and about 20 microns from first electrode 56, such as between about 1 micron and about 10 microns, for example about 3 microns. The practical thickness of the layers on the P side of junction 54 will depend on the semiconductor material used, the construction of junction 54, and the range of the beta particles in the semiconductor material of substrate 52.

In one example, second electrode 60 also comprises a beta-emitting radioisotope in order to increase the amount of beta particles to which junction 54 is exposed. As with first electrode 56, in order to maximize the exposure of P-N junction 54 to beta particles, the beta-emitting material of second electrode 60 is positioned as close as is practical to P-N junction 54. P-N junction 54 is positioned close to second electrode 60 in much the same manner as described above with first electrode 56, namely, by configuring the layer(s) on the N side of P-N junction 54 to be as thin as is practical while still providing a sufficient thickness for the formation of the depletion zone. In one example, semiconductor substrate 52 is configured so that P-N junction 54 is positioned proximate to the beta-emitting material of second electrode 60, such as within about 10 microns from second electrode 60, for example within about 5 microns of second electrode 60, such as within about 3 microns of second electrode 60. In one example, P-N junction 54 is between about 0.5 microns and about 20 microns from second electrode 60, such as between about 1 micron and about 10 microns, for example about 3 microns. The practical thickness of the layers on the N side of junction 54 will depend on the semiconductor material used, the construction of junction 54, and the range of the beta particles in the semiconductor material of substrate 52.

P-N junction 54 is formed between an n type region and a p type region. In the example shown in FIG. 2A, the n type region comprises an n doped layer 64 and the p type region comprises a p doped layer 66 that are in close contact to one another. The terms "n doped" or "n type" as it is used in this disclosure with respect to a P-N junction refers to a semiconductor material that includes a dopant that provides for excess electrons to act as negative, or "n type," mobile charge carriers. In one example, an n type dopant donates one or more valence electrons to the semiconductor material of semiconductor substrate 52. Examples of dopants that are used for n type doping of group IV solids, such as silicon and germanium, include group V elements such as phosphorus, arsenic, or antimony. Examples of n type dopants that are used for 4H—SiC and 6H—SiC include nitrogen and phosphorus.

The term "p doped" or "p type" as it is used in this disclosure with respect to a P-N junction refers to a semiconductor material that includes a dopant that provides for excess holes to act as positive, or "p type," mobile charge carriers. In the example semiconductor substrate 52 shown in FIG. 2A, p doped layer 66 is closer to first electrode 76 that comprises the beta-emitting radioisotope than n doped layer 64. In one example, a p type dopant accepts an electron from the semiconductor material of semiconductor substrate 52. Examples of dopants that are used for p type doping of group IV solids (silicon and germanium) include group IIIA elements such as boron or aluminum. Examples of p type dopants that are used for 4H—SiC and 6H—SiC include aluminum, boron, and gallium.

Doped layers 64 and 66 may be formed by imbuing the appropriate portions of the semiconductor material of semiconductor substrate 52 with the appropriate type of dopant, n type dopant for n doped layer 64 and p type dopant for p doped layer 66. The dopant may be introduced to the semiconductor material by diffusion or ion implantation. Doped layers 64 and 66 may also be formed by depositing the semiconductor material of each layer 64, 66 in the presence of the appropriate type of dopant, such as through chemical vapor deposition wherein the dopant is present in the deposition chamber. In one example, epitaxial deposition is performed in the presence of dopant in order to epitaxially grow each doped layer 64, 66 such that each layer will have the same monocrystalline orientation as the layer below it. In one example, shown in FIG. 2A, n doped layer 64 is deposited onto a semiconductor substrate 68 by epitaxial deposition of a semiconductor material in the presence of an n type dopant. P doped layer 66 is then deposited onto n doped layer 64 by epitaxial deposition of a semiconductor material in the presence of a p type dopant. Other deposition methods may be used to deposit p doped and n doped layers of semiconductor substrate 52, such as atomic layer epitaxy.

In one example, n doped layer 64 is epitaxially deposited onto substrate 68, which is also doped with an n type dopant. N doped substrate 68 may be formed by crystal growth of the material to a monocrystalline structure that is cut and polished to form N doped substrate 68. In one example, substrate 68 comprises a semiconductor material that is moderately to heavily doped with an n type dopant, referred to herein as an "n+ semiconductor material" or "n-plus semiconductor material." The terms "moderately to heavily doped" and "n+ semiconductor material" as used herein refer to a semiconductor material that includes more dopant than is required to form a semiconductor that provides excess electron charge carriers. In one example, n+ layer 68 comprises more dopant than is in n doped layer 64. In such a case, n doped layer 64 may comprise a semiconductor material that may be considered to be lightly to moderately doped with the n type dopant, referred to herein as a "n– semiconductor material" or "n-minus semiconductor material." In one example, the amount of n type dopant that is included in n+ layer 68 is high enough that n+ layer 68 provides a low-resistance path for electrons such that n+ layer 68 acts like a conductor for electrons, also referred to as a degenerate n type semiconductor. In contrast, the n– semiconductor material of n doped layer 64, while still allowing mobile charge carriers to pass, provides a resistance path for electrons or holes attempting to flow through n doped layer 64.

Continuing with the example semiconductor substrate 52 of FIG. 2A, p doped layer 66 may be deposited onto n doped layer 64. In one example, p doped layer 66 is formed by epitaxial deposition of a semiconductor material onto n doped layer 64 in the presence of a p type dopant in order to form a monocrystalline structure having the same orientation as n doped layer 64. In one example, p doped layer 66 comprises a semiconductor material that is lightly to moderately doped with the p type dopant, referred to herein as a "p– semiconductor material" or "p-minus semiconductor material." Like the n– semiconductor material described above with respect to n doped layer 64, a p– semiconductor layer comprises sufficient dopant to create an excess of positive charge carriers, e.g., holes, while still providing some resistance to the flow of holes or electrons through p doped layer 66. P-N junction 54 is formed between the epitaxially grown n doped layer 64 comprising an n– semiconductor material and p doped layer 66 comprising a p– semiconductor material.

Semiconductor substrate 52 may also comprise a thin p doped layer 70 between p doped layer 66 of P-N junction 54 and electrode 56. In one example, layer 70 is formed by epitaxial deposition of a semiconductor material onto p doped layer 66 in the presence of a p type dopant in order to form a monocrystalline structure having the same orientation as p doped layer 66. In one example, thin p doped layer 70 comprises a semiconductor material that is moderately to heavily doped with an p type dopant, referred to herein as a "p+ semiconductor material" or "p-plus semiconductor material." The terms "moderately to heavily doped" and "p+ semiconductor material" as used herein refer to a semiconductor material that includes more dopant than is required to form a semiconductor that provides excess hole charge carriers. In one example, the amount of p type dopant that is included in p+ layer 70 is high enough that p+ layer 70 provides a low-resistance path such that p+ layer 70 acts like a conductor. In contrast, the p– semiconductor material of p doped layer 66, while still allowing mobile charge carriers to pass, provides a resistive path for holes attempting to flow through p doped layer 66.

Continuing with FIG. 2A, once the entirety of semiconductor substrate 52 is complete, including n+ layer 68, n– layer 64, P-N junction 54, p– layer 66, and p+ layer 70, electrodes 56 and 60 are deposited so that first electrode 56 is electrically connected to either the n– layer or the p– layer of P-N junction 54 while second electrode 60 is electrically connected to the other layer of P-N junction 54. In the example of FIG. 2A, first electrode 56 is electrically connected to p– layer 66 while second electrode 60 is electrically connected to n– layer 64. In one example, first electrode 56 is in ohmic contact with p+ layer 70, and p+ layer 70 is deposited directly onto p– layer 66. As noted above, the p+ semiconductor material of p+ layer 70 provides a low-resistance path, so that an electrical connection is formed between first electrode 56 and p– layer 66 through p+ layer 70. In one example, second electrode 60 is in ohmic contact with n+ layer 68, and n– layer 64 is deposited directly onto n+ layer 68. As noted above, the n+ semiconductor material of n+ layer 68 provides a low-resistance path, so that an electrical connection is formed between second electrode 60 and n– layer 64 through n+ layer 68. In one example, electrodes 56 and 60 each comprise an ohmic contact between the metallic material that comprises each electrode 56 and 60 and the semiconductor material of semiconductor substrate 52. Electrodes 56 and 60 may be connected to a load via contact pads, connecting wires, or flip chip connections, such as the connection wires shown in FIGS. 1A-1D.

The configuration of P-N junction 54 allows semiconductor substrate 52 to convert beta particles into electrical current. Because n doped layer 64 comprises an excess of electron mobile charge carriers compared to p doped layer 66, electrons diffuse across P-N junction 54 into p doped layer 66. This leaves behind a positive donor ion in n doped layer 64. Similarly, because p doped layer 66 comprises an excess of hole mobile charge carriers compared to n doped layer 64, holes diffuse across P-N junction 54 into n doped layer 64. This leaves behind a negative donor ion in p doped layer 66. Electrons that diffuse across P-N junction 54 into p doped layer 66 may recombine with holes and be eliminated while holes that diffuse across P-N junction 54 into n doped layer 64 may recombine with electrons and also be eliminated. The diffusion across P-N junction 54 and recombination of mobile charge carriers creates a zone on either side of P-N junction where there are little to no mobile charge carriers available, referred to as the depletion zone, depletion region, or space charge region. The diffusion across P-N junction 54 and recombination of electrons and holes also creates an electrical imbalance, forming an electric field that counteracts further diffusion of electrons from n doped layer 64 to p doped layer 66 and of holes from p doped layer 66 to n doped layer 64.

As noted above, when a beta particle is absorbed by semiconductor substrate 52 and energy from the absorbed beta particle is sufficient, it will excite electrons into the conduction band of semiconductor substrate 52, creating an electron-hole pair. Electrons formed on the n side of P-N junction 54 are generally prevented from crossing P-N junction 54 due to the electric field that is created in the depletion zone while the corresponding holes are swept across P-N junction 54 by the electric field. Electrons formed on the p side of P-N junction 54 are swept across P-N junction 54 by the electric field while the corresponding holes are prevented from crossing P-N junction by the electric field. When die 50 is connected to a load to complete a circuit between electrodes 56 and 60, electrons formed on the n side or that are swept across P-N junction 54 from the p side are swept from n doped layer 64 through n+ layer 68, into second electrode 60 and through the circuit. The electrons that flow through the circuit then flow into first electrode 56, through p+ layer 70 and into p doped layer 66, where they recombine with holes formed as part of the electron-hole pairs. Therefore, in the example of FIG. 2A, first electrode 56 acts as the cathode of die 70 and second electrode 60 acts as the anode.

Figure 2B:
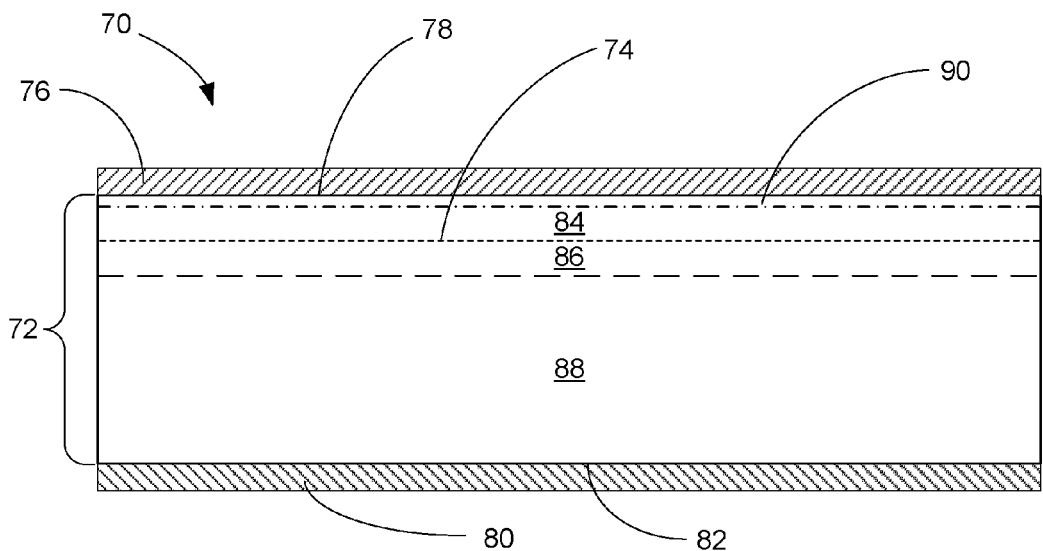

Turning to FIG. 2B, another example die 70 comprising a semiconductor substrate 72 is shown. Die 70 is similar to die 50 described above with respect to FIG. 2A, except that the layers that form the P-N junction 74 within semiconductor substrate 72 are reversed. Die 70 comprises a first electrode 76 comprising a beta-emitting radioisotope and a second electrode 80 deposited on semiconductor substrate 72. Like P-N junction 54 of semiconductor substrate 52 shown in FIG. 2A, P-N junction 74 is formed between an n doped layer 84 and a p doped layer 86. However, unlike semiconductor substrate 52, it is n doped layer 84 that is electrically connected to first electrode 76, rather than the p doped layer 66 of semiconductor substrate 52. P doped layer 86 of semiconductor substrate 72 is electrically connected to second electrode 80. Moreover, semiconductor substrate 72 comprises a p+ layer 88 that p doped layer 86 is deposited on. Finally, semiconductor substrate 72 comprises a thin n+ layer 90 deposited between n doped layer 84 and first electrode 76 rather than the thin p+ layer of semiconductor substrate 52.

In one example, first electrode 76 is in ohmic contact with n+ layer 90, and n+ layer 90 is deposited directly onto n– layer 84. As noted above, the n+ semiconductor material of n+ layer 90 provides a low-resistance path for electrons, so that an electrical connection is formed between first electrode 76 and n– layer 84 through n+ layer 90. In one example, second electrode 80 is in ohmic contact with p+ layer 88, and p– layer 86 is deposited directly onto p+ layer 88. As noted above, the p+ semiconductor material of p+ layer 88 provides a low-resistance path, so that an electrical connection is formed between second electrode 80 and p– layer 86 through p+ layer 88.

Die 70 operates in much the same fashion as die 50, with electrons and holes being swept across P-N junction 74 so that electron-hole pairs created by beta particles can be turned into current through a circuit, except that first electrode 76 acts as the anode and second electrode 80 acts as the cathode of die 70, rather than the opposite arrangement described above for die 50.

The example semiconductor substrates 52 and 72 described above with respect to FIGS. 2A and 2B may be used as the semiconductor substrate 12A, 12B in any of the configurations shown in FIGS. 1A-1D, or as the semiconductor substrate in any other examples of power converters described in this disclosure.

Semiconductor substrates 12A, 12B, 52, and 72 each comprise a semiconductor material that is capable of being doped in the arrangements shown in FIGS. 2A and 2B. The semiconductor material that is used in a particular die 50, 70 will depend on the desired power output from the power converter that is formed from die 50, 70. As noted above, the power output depends in part on the energy output from the beta-emitting isotope that is used in first electrode 56, 76. However, properties of the semiconductor material can also affect the power output of the power converter. In particular, the band gap of the semiconductor material, as well as the built in potential of the junction and the source activity, limit the voltage that may be provided by each die. The resistance of the semiconductor material to breakdown from exposure to beta particles, or beta radiation hardness, may also be a consideration. Example semiconductor materials that may be used as semiconductor substrates include silicon, silicon carbide, germanium, and gallium arsenide. In one example, silicon carbide, such as 4H or α 6H silicon carbide, is used as the semiconductor material due to its band gap value of about 3 eV and because of its greater beta radiation hardness as compared to silicon. In one example, a die formed from silicon carbide with the arrangements described in this disclosure are capable of having an maximum voltage output of between about 1 volt and about 4 volts, such as about 2 or 3 volts from each die.

Two or more dice, such as dice 10A, 10B, 50, and 70, may be stacked in various combinations to achieve a desired voltage and current output. When two dice are connected in parallel to form a parallel stack, the stack will output the same voltage as the individual dice, but the total current that the combined stack can produce will equal the sum of the current produced by each die. For example, if two dice are bonded together in parallel to form a parallel die stack, such as the example power converter 2 described above with respect to FIG. 1B, wherein each die individually produces a voltage of x volts and a current of y amperes, the total voltage that could be delivered by the die stack is still x volts, but the die stack can produce a current of 2y amperes, rather than just y amperes that is produced by each die individually.

Similarly, when two dice are connected in series, such as in power converter 1 as described above with respect to FIG. 1A, the total current output will not be changed, but the total voltage output will be equal to the sum of the voltage provided by each die. For example, using the same dice that individually produce a voltage of x volts at a current of y amperes, if the dice are bonded together in series to form a series die stack, the voltage that can be delivered by the series die stack will be 2x volts, rather than the x volts of each individual die, while the current provided by the series die stack will remain y amperes. The rules of adding voltages for series stacks and adding currents for parallel stacks can be used to create combinations of die stacks with the desired voltage and current output for a particular application. FIGS. 3-6 show several example power converters with dice stacked in various parallel and series configurations to demonstrate these rules.

Figure 3A:
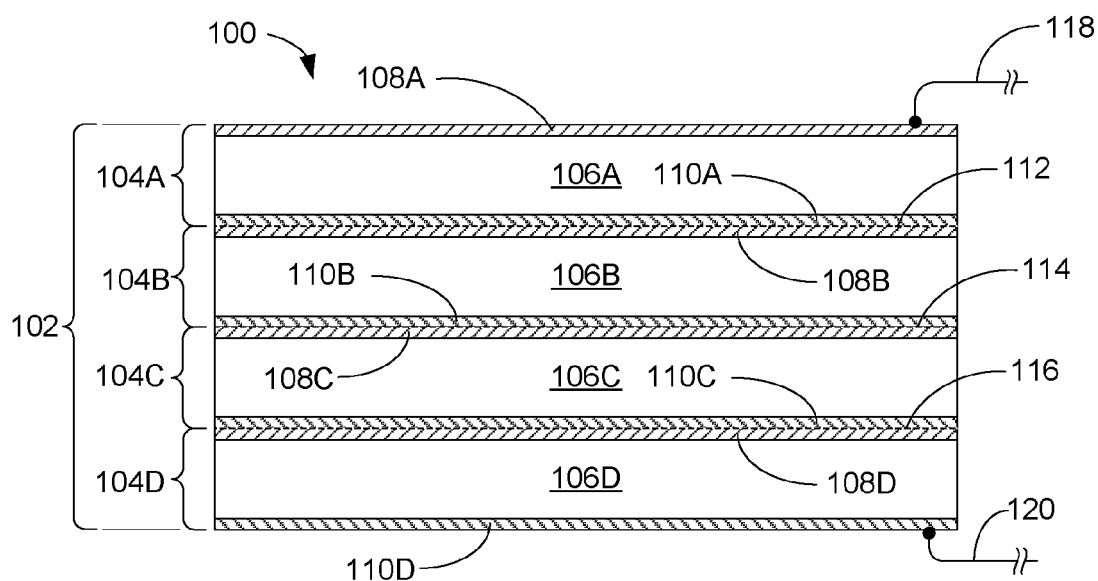
FIG. 3A is a schematic diagram of an example betavoltaic power converter comprising four dice connected in series.

FIG. 3A shows a power converter 100 comprising a stack 102 of four dice 104A, 104B, 104C, and 104D (collectively referred to herein as "die 104" or "dice 104"), each comprising a semiconductor substrate, shown as substrate 106A for die 104A, substrate 106B for die 104B, substrate 106C for die 104C, and substrate 106D for die 104D (collectively referred to herein as "semiconductor substrate(s) 106"). Semiconductor substrates 106 collect electron-hole pairs created by beta particle absorption using a P-N junction between a p type region and an n type region of semiconductor substrate 106. The P-N junction and p type and n type regions are not shown in FIG. 3A for the sake of simplicity. However, the P-N junction of each semiconductor substrate 106 may be the same as described with respect to FIGS. 1A-1D or FIGS. 2A-2B.

A first electrode 108A, 108B, 108C, 108D (collectively referred to herein as "first electrode(s) 108") comprising a beta-emitting radioisotope and a second electrode 110A, 110B, 110C, 110D (collectively referred to herein as "second electrode(s) 110") are deposited on each semiconductor substrate 106. As with dice 10A, 10B, first electrode 108 of each die 104 is electrically connected to one of the p type region or the n type region of semiconductor substrate 106 of the die 104, while second electrode 110 is electrically connected to the other. In one example, the first electrodes 108 are all electrically connected to the same type of region so that first electrodes 108 are all the same type of electrode, e.g., all electrically connected to p type regions so that they are all cathodes, and the second electrodes 110 are all connected to the opposite type of region so that second electrodes 110 are all the opposite type of electrode, e.g., all electrically connected to the n type regions so that they are all anodes.

A bond is formed between electrodes of adjacent dice 104 in order to form stack 102, such that the second electrode 110 of one die 104 is bonded to the first electrode 108 of the next die 104. In the example shown in FIG. 3A, a first bond 112 is formed between second electrode 110A of first die 104A and first electrode 108B of second die 104B, a second bond 114 is formed between second electrode 110B of second die 104B and first electrode 108C of third die 104C, and a third bond 116 is formed between second electrode 110C of third die and first electrode 108D of fourth die 104D. Each bond 112, 114, 116 both mechanically couples the bonded electrodes and provides an electrical contact between the bonded electrodes. In one example, bond 112, 114, 116 between adjacent dice 104 may be formed by any of the bonding methods described above, including welding, solid-state bonding, or through the use of an adhesive along with a conduction pathway, such as conductive filler. In one example, each bond 112, 114, 116 is formed by diffusion bonding wherein the two electrodes being bonded are pressed together at an elevated pressure and temperature, forming a bond between the bonded electrodes at the atomic level by providing for closure of the mating surfaces due to local plastic deformation and interdiffusion of the bonded electrodes. Each bond 112, 114, 116 may be formed separately, or all bonds 112, 114, 116 may be formed substantially simultaneously, such as by pressing all four dice 104 together in the arrangement shown at the pressure necessary and subjecting the resulting stack to the temperature necessary to form a diffusion bond between adjacent electrodes.

Once bonds 112, 114, and 116 are created and stack 102 is formed, it may be connected to a load in order to form a circuit. As shown in FIG. 3A, first electrode 108A of first die 104A is connected to the circuit via connection wire 118 and second electrode 110D of fourth die 104D is connected to the circuit via connection wire 120. Other connection structures, such as contact pads and or flip chip solder bumps, may also be used. As described above, the first electrode 108 of each die 104 is the same type of electrode, so that if first electrodes 106 are the cathodes of each die 104, then first electrode 108A of first die 104A and connection wire 118 act as the cathode for stack 102. Similarly, if the second electrodes 110 are the anodes of each die 104, then second electrode 110D of fourth die 104D and connection wire 120 act as the anode for stack 102.

Figure 3B:
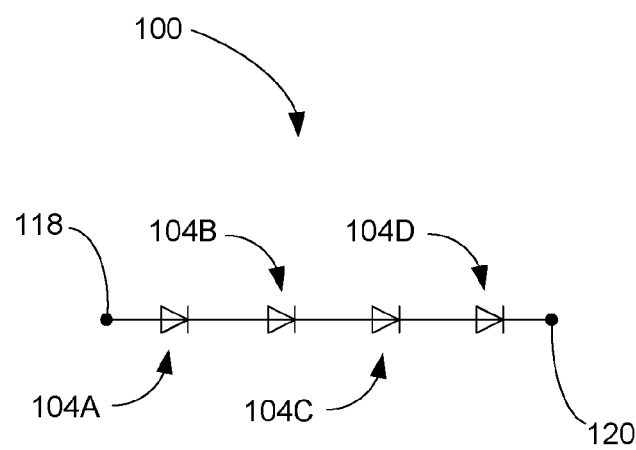
FIG. 3B is a schematic diagram of an equivalent circuit of the example betavoltaic power converter of FIG. 3A.

Power converter 100 is shown schematically in the circuit diagram of FIG. 3B, with each die 104 being represented as a diode that is sensitive to beta particles. If it is assumed, as in the example described above, that each die 104 has a maximum voltage output of x volts and a maximum current output of y amperes, then stack 102 of FIGS. 3A and 3B can have a maximum voltage output of 4x volts and a maximum current output of y amperes.

Figure 4A:
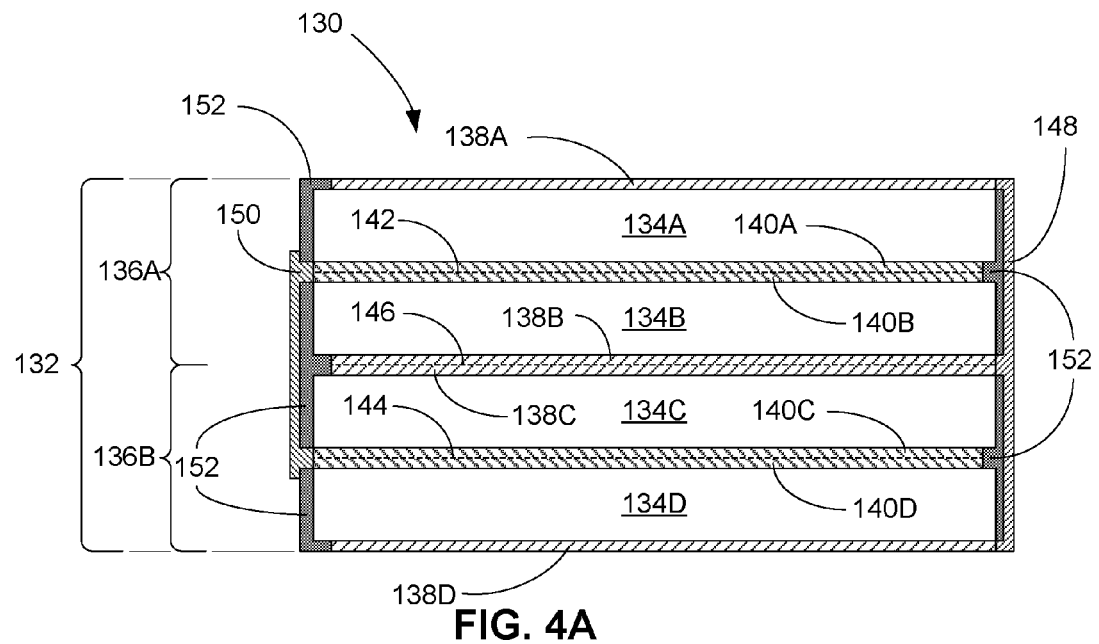
FIG. 4A is a schematic diagram of an example betavoltaic power converter comprising four dice connected in parallel.

FIG. 4A shows another power converter 130 formed of a stack 132 of four dice 134A, 134B, 134C, and 134D (collectively referred to herein as "die 134" or "dice 134"). Dice 134 are arranged in two primary stacks 136A, 136B (collectively referred to herein as "primary stack(s) 136") with each primary stack 136 comprising two dice 134 connected in parallel to each other (described below). The two primary stacks 136 are also connected in parallel to each other in order to form stack 132 of power converter 130.

Each die 134 may comprise the configuration of any die described above, such as dice 10A and 10B as described with respect to FIGS. 1A-1D, die 50 as described with respect to FIG. 2A, die 70 as described with respect to FIG. 2B, or dice 104 as described with respect to FIGS. 3A and 3B. Each die 134 comprises a semiconductor substrate configured for the collection of electron-hole pairs, such as a P-N junction, with a first electrode 138A, 138B, 138C, 138D (collectively referred to herein as "first electrode(s) 138") comprising a beta-emitting radioisotope and a second electrode 140A, 140B, 140C, 140D (collectively referred to herein as "second electrode(s) 140") deposited on opposite sides of the semiconductor substrate. In the example power converter 130 of FIG. 4A, the first electrodes 138 are all connected to the same type of region so that first electrodes 138 are the same type of electrode, e.g., all connected to a p type region so that all are cathodes, and the second electrodes 140 are all connected to the opposite type of region so that the second electrodes 140 are all the opposite type of electrode, e.g., all connected to a n type region so that all are anodes.

Each primary stack 136 comprises a pair of dice 134 bonded together in a parallel configuration. In the example shown in FIG. 4A, first die 134A and second die 134B are bonded together to form first primary stack 136A by bonding second electrode 140A of first die 134A to second electrode 140B of second die 134B. A bond 142 is formed between second electrode 140A and second electrode 140B to mechanically couple bonded electrodes 140A and 14B and also to provide an electrical contact between electrodes 140A and 140B. In one example, bond 142 may be formed by any of the bonding methods described above, including welding, solid-state bonding, or through the use of an adhesive along with a conduction pathway, such as conductive filler. In one example, bond 142 is formed by diffusion bonding between second electrode 140A and second electrode 140B. As noted above, second electrodes 140 of each die 134 are the same type of electrode so that the bonding and electrical connection of second electrodes 140A and 140B creates a parallel connection between dies 134A and 134B. For example, each second electrode 140 may act as the anode for each die 134, so that the bonded and electrically connected second electrodes 140A, 140B will act as a parallel-connected anode of primary stack 136A, and first electrodes 138A, 138B, if electrically connected together, may act as a parallel-connected cathode of primary stack 136A.

In the example shown in FIG. 4A, third die 134C and fourth die 134D are bonded together to form second primary stack 136B by bonding second electrode 140C of third die 134C to second electrode 140D of fourth die 134D. A bond 144 is formed between second electrode 140C and second electrode 140D to mechanically couples bonded electrodes 140C and 14D and also to provide an electrical contact between electrodes 140C and 140D. In one example, bond 144 may be formed by any of the bonding methods described above, including welding, solid-state bonding, or through the use of an adhesive along with a conduction pathway, such as conductive filler. In one example, bond 144 is formed by diffusion bonding between second electrode 140C and second electrode 140D. As noted above, second electrodes 140 of each die 134 are the same type of electrode so that the bonding and electrical connection of second electrodes 140C and 140D creates a parallel connection between dies 134C and 134D. For example, each second electrode 140 may act as the anode for each die 134, so that the bonded and electrically connected second electrodes 140C, 140D will act as a parallel-connected anode of primary stack 136B, and first electrodes 138C, 138D, if electrically connected together, may act as a parallel-connected cathode of primary stack 136B.

Primary stacks 136 are also bonded together in a parallel arrangement. A bond 146 is formed between a first electrode 138 of each primary stacks 136 to mechanically couple primary stacks 136 and also to provide an electrical contact between the bonded first electrodes 138. In the example shown in FIG. 4A, bond 146 is formed between first electrode 138B of second die 134B, which is part of first primary stack 136A, and first electrode 138C of third die 134C, which is part of second primary stack 136B. However, as noted above, first electrodes 138 of each die 134 are the same type of electrode, and thus either first electrode 138 of each primary stack 136 could have been used. For example, a bond similar to bond 146 could be formed between first electrode 138A of first die 134A, which is part of first primary stack 136A, and first electrode 138D of fourth die 134D, which is part of second primary stack 138B, with the same effect. In one example, bond 146 may be formed by any of the bonding methods described above, including welding, solid-state bonding, or through the use of an adhesive along with a conduction pathway, such as conductive filler. In one example, bond 146 is formed by diffusion bonding between first electrode 138B from first primary stack 136A and first electrode 138D from second primary stack 136B.

Each bond 142, 144, 146 may be formed separately, or all bonds 142, 144, 146 may be formed substantially simultaneously, such as by pressing all four dice 134 together in the arrangement shown in FIG. 4A at the pressure necessary and subjecting the resulting stack to the temperature necessary to form a diffusion bond between adjacent electrodes.

As noted above, first electrodes 138 of each die 134 are the same type of electrode so that the bonding and electrical connection between first electrodes 138 of the primary stacks 136 creates a parallel connection between primary stacks 136A and 136B. Continuing with the example described above where each second electrode 140 acts as the anode for each die 134 and first electrodes 138 act as the cathode, the bonded and electrically connected first electrodes 138B and 138C of each primary stack 136A, 136B along with the non-bonded first electrodes 138A and 138D, if electrically connected together, may act as a parallel-connected cathode of stack 132, while electrodes 140A, 140B, 140C, and 140D, if electrically connected together, may act as a parallel-connected anode of stack 132.

Electrical interconnection between first electrodes 138 within stack 132 and between second electrodes 140 within stack 132 is accomplished in part by bonds 142, 144, and 146, as described above. However, in order to form a full parallel connection of dice 134 within stack 132, all first electrodes 138 are interconnected and all second electrodes 140 are interconnected. Interconnection may be accomplished with connection wires, or through interconnects formed on stack 132. In the example of FIG. 4A, interconnect 148 electrically interconnects first electrodes 138 and interconnect 150 electrically interconnects second electrodes 140. Interconnect 148 is electrically coupled to each first electrode 138 in order to provide an electrical conduction path between all first electrodes 138. Interconnect 150 is electrically coupled to each second electrode 140 in order to provide an electrical conduction path between all second electrodes 140.

Interconnects 148 and 150 may also act as a contact area, also referred to as a contact pad, for connecting power converter 130 to a circuit and a load to be powered. In such a case, interconnect 148 may act as a contact pad for first electrodes 138, while interconnect 150 may act as a contact pad for second electrodes 140. In one example, each first electrode 138 acts as the cathode and each second electrode 140 acts as the anode of their respective dice 134 such that interconnect/contact pad 148 acts as the cathode for stack 132 of power converter 130, while interconnect/contact pad 150 acts as the anode for stack 132 of power converter 130.

Interconnect 148 may comprise any material that can provide for an electrical connection to the material or materials of first electrodes 138 while interconnect 150 may comprise any material that can provide for an electrical connection to the material or materials of second electrodes 140. In one example, interconnects 148, 150 comprise a metal that can provide direct metal-to-metal contact to electrodes 138, 140. Examples of materials that may be used in interconnects 148, 150 include copper, tungsten, aluminum, gold, a gold-tin alloy, a tin-lead alloy, an aluminum alloy, such as AlCu, or a conductive epoxy.

Stack 132 may also comprise electrical isolation material 152 to prevent interconnect 148 from coming into electrical contact with second electrodes 140 and to prevent interconnect 150 from coming into electrical contact with first electrodes 138. Isolation material 152 also electrically isolates each interconnect 148, 150 from the semiconductor substrate in order to avoid a short circuit of the P-N junction within the semiconductor substrate. In one example, isolation material 152 prevents either interconnect 148, 152 from contacting each side of the P-N junction so that electrons collected by the P-N junction do not bypass the circuit and the load. In one example, isolation material 152 isolates each interconnect 148, 150 completely from the semiconductor material in order to prevent any electrical contact between the semiconductor substrate and interconnects 148, 150.

Isolation material 152 may comprise any material capable of electrically isolating interconnects 148, 150 from electrodes 138, 140 and the semiconductor substrate. Examples of materials that may be used as isolation material 152 include dielectric materials, for example sapphire, glass, porcelain, or other ceramics, such as silicon oxide, silicon nitride, and aluminum oxide, or insulation materials, such as a organic film, for example a polyimide film.

Figure 4B:
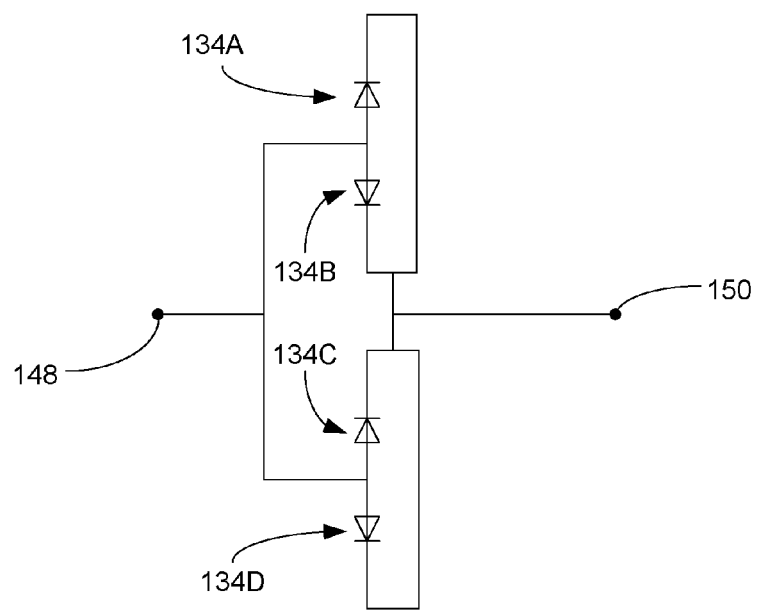
FIG. 4B is a schematic diagram of an equivalent circuit of the example betavoltaic power converter of FIG. 4A.

FIG. 4B shows a schematic circuit diagram of power converter 130 shown in FIG. 4A. Each die 134 is represented as a diode that is sensitive to beta particles. If it is assumed, as in the examples described above, that each die 134 has a maximum voltage output of x volts and a maximum current output of y amperes, then stack 132 of FIG. 4A can have a maximum voltage output of x volts and a maximum current output of 4y amperes.

Figure 5A:
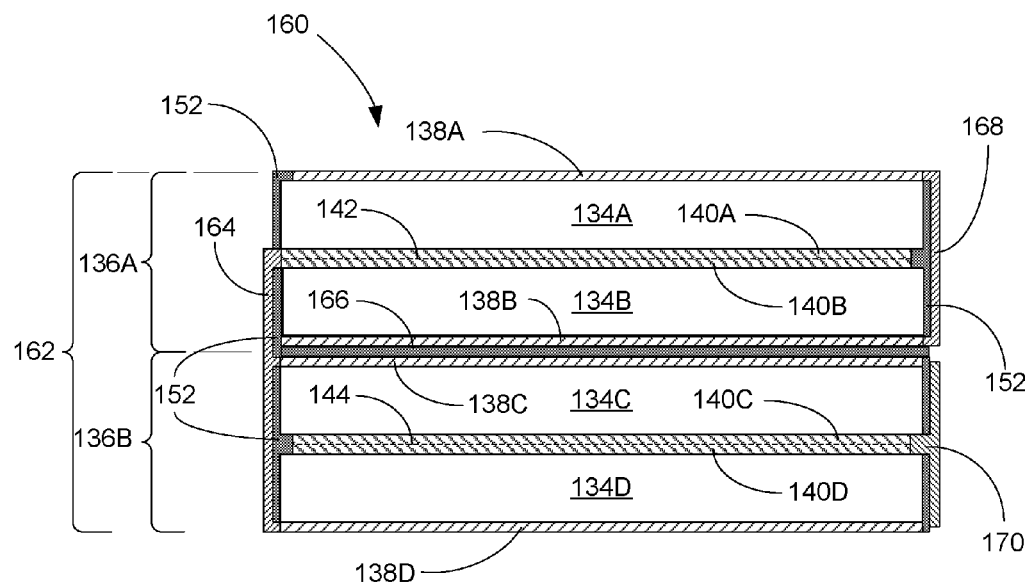
FIG. 5A is a schematic diagram of an example betavoltaic power converter comprising two primary stacks connected in series, each primary stack comprising a pair of dice connected in parallel.

FIG. 5A shows another power converter 160 formed of a stack 162 of four dice. The individual dice of power converter 160 are no different from dice 134 described above with respect to power converter 130 in FIG. 4A. Therefore, when appropriate, the same reference numerals are used herein when describing similar components of power converter 160. As with stack 132 of power converter 130, stack 162 comprises dice 134 that are arranged into two primary stacks 136 each comprising two dice 134 connected in parallel to each other. However, primary stacks 136 of power converter 160 are connected in series, rather than the parallel connection of power converter 130, to form stack 162 of power converter 160.

In the example power converter 160 of FIG. 5A, a bond is formed between first die 134A and second die 134B to form first primary stack 136A, such as bond 142 that mechanically couples and electrically connects second electrode 140A of first die 134A to second electrode 140B of second die 134B. Another bond is formed between third die 134C and fourth die 134D to form second primary stack 136B, such as bond 144 that mechanically couples and electrically connects second electrode 140C of third die to second electrode 140D of fourth die 134D. As noted above, second electrodes 140 of each die 134 are the same type of electrode so that the bonding and electrical connection of second electrodes 140A and 140B creates a parallel connection between dies 134A and 134B and the bonding and electrical connection of second electrodes 140C and 140D creates a parallel connection between dies 134C and 134D. For example, each second electrode 140 may act as the anode for each die 134, so that the bonded and electrically connected second electrodes 140A, 140B may act as a parallel-connected anode of first primary stack 136A while first electrodes 138A, 138B, if electrically connected together, may act as a parallel-connected cathode of first primary stack 136A. Similarly, the bonded and electrically connected second electrodes 140C, 140D may act as a parallel-connected anode of second primary stack 136B while first electrodes 138C, 138D, if electrically connected together, may act as a parallel-connected cathode of second primary stack 136B.

First primary stack 136A is connected in series to second primary stack 136B in order to form series stack 162. In the example shown in FIG. 5A, primary stacks 136 are connected in series with an interconnect 164 that electrically connects second electrodes 140A and 140B of first primary stack 136A to first electrodes 138C and 138D of second primary stack 136B. An isolation layer 166 is deposited between first primary stack 136A and second primary stack 136B to isolate first electrode 138B of first primary stack 136A from first electrode 138C of second primary stack 136B.

Isolation layer 166 may comprise any material capable of electrically isolating interconnects electrodes 138B and 138C. Examples of materials that may be used as in isolation layer 166 include dielectric materials, for example sapphire, glass, porcelain, or other ceramics, such as silicon oxide, silicon carbide, silicon nitride, and aluminum oxide.

Stack 162 may also comprise an interconnect 168 to electrically interconnect first electrodes 138A and 138B of first primary stack 136A. Interconnect 168 may also act as a contact pad to provide a connection point to the circuit and load to be powered by power converter 160. A contact pad 170 that is electrically connected to second electrodes 140C, 140D of second primary stack 136B may also be provided in order to provide a connection point to the circuit and load. Power converter 160 may be connected to a circuit in order to power a load, such as by connecting wires (not shown) to interconnect/contact pad 166 and contact pad 168 or by flip chip solder balls. In one example, each first electrode 138 acts as the cathode and each second electrode 140 acts as the anode of their respective dice 134 such that contact pad 168 acts as the cathode for stack 162 of power converter 160, while contact pad 170 acts as the anode for stack 162 of power converter 160.

Stack 162 may also comprise electrical isolation material 152 to prevent undesirable electrical connection. As shown in FIG. 5A, electrical isolation material 152 may isolate interconnect 164 from first electrodes 138A and 138B of first primary stack 136A and from second electrodes 140C and 140D of second primary stack 136B. Isolation material 152 also may electrically isolate interconnect 168 from second electrodes 140A and 140B of first primary stack 136C. Isolation material 152 also may electrically isolate contact pad 170 from first electrodes 138C and 138D of second primary stack 136B. Isolation material 152 also may electrically isolate each interconnect/contact pad 164, 168, 170 from the semiconductor substrates of dice 134 in order to avoid a short circuit of the P-N junction within the semiconductor substrate.

Figure 5B:
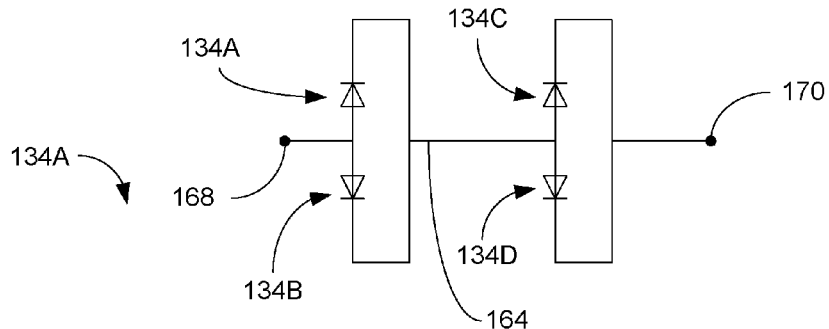
FIG. 5B is a schematic diagram of an equivalent circuit of the example betavoltaic power converter of FIG. 5A.

FIG. 5B shows a schematic circuit diagram of power converter 160 shown in FIG. 5A with each die 134 is represented as a diode that is sensitive to beta particles. If it is assumed, as in the examples described above, that each die 134 has a maximum voltage output of x volts and a maximum current output of y amperes, then each primary stack 136 comprising two parallel-connected dice 134 has a maximum voltage output of x volts and a maximum current output of 2y amperes. Stack 162, formed by connecting primary stacks 136A and 136B in series, has a maximum voltage output of 2x volts and a maximum current output of 2y amperes.

Figure 6A:
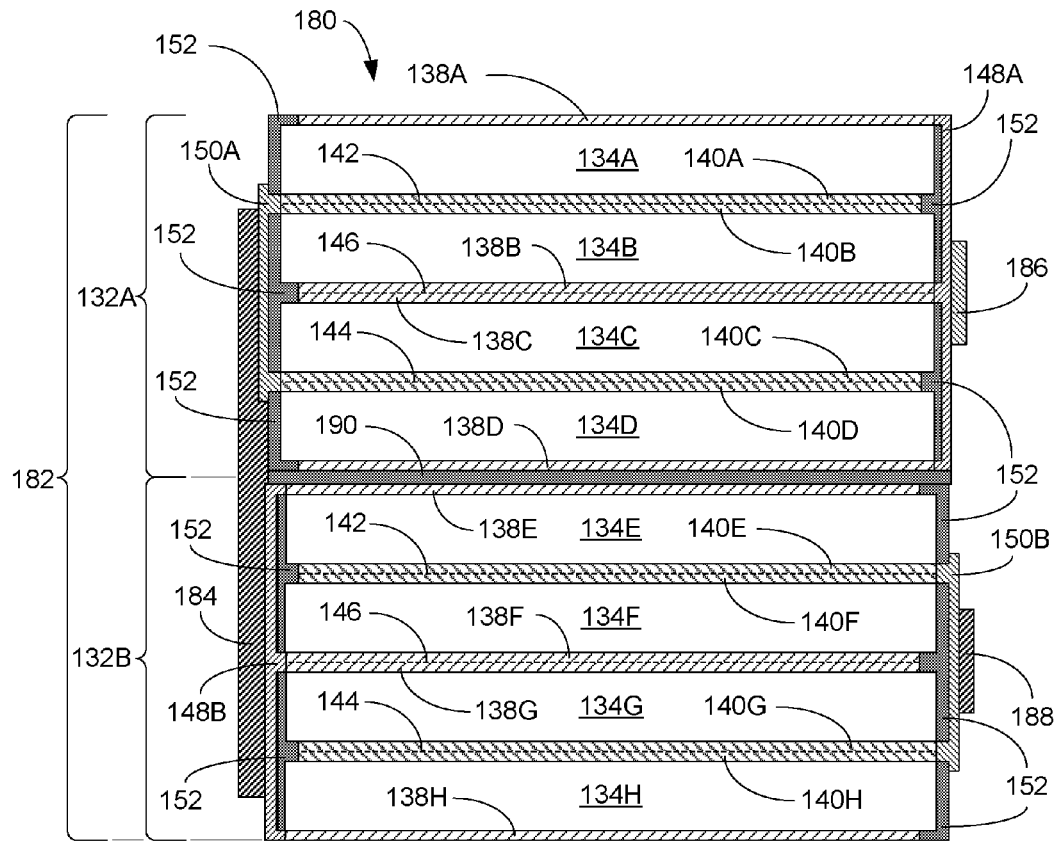
FIG. 6A is a schematic diagram of an example betavoltaic power converter comprising two parallel stacks connected in series, each parallel stack comprising four dice connected in parallel.

FIG. 6A is a schematic diagram of yet another power converter 180 comprising eight individual dice. The individual dice of power converter 180 are no different from dice 134 described above with respect to power converter 130 in FIG. 4A or power converter 160 in FIG. 5A. Therefore, when appropriate, the same reference numerals are used herein when describing similar components of power converter 180. Dice 134A, 134B, 134C, 134D, 134E, 134F, 134G, and 134H (collectively referred to herein as "die 134" or "dice 134") are arranged into two parallel stacks that are functionally identical to stack 132 described above with respect to FIG. 4A. Each parallel stack 132A, 132B (collectively referred to herein as "parallel stack(s) 132" or "stack(s) 132") comprises four dice 134, with two pairs of dice 134 each being connected in parallel to each other, and the two pairs being connected in parallel to each other. Parallel stacks 132A and 132B are connected in series to one another.

In the example power converter 180 shown in FIG. 6A, a first parallel stack 132A is connected in series to second parallel stack 132B. Both first parallel stack 132A and second parallel stack 132B are functionally identical to stack 132 described above with respect to FIG. 4A. As described above with respect to FIG. 4A, first electrodes 138 of first parallel stack 132A are electrically interconnected by interconnect 148A, while second electrodes 140 of first parallel stack 132A are electrically interconnected by interconnect 150A. Similarly, first electrodes 138 of second parallel stack 132B are electrically interconnected by interconnect 148B, while second electrodes 140 of second parallel stack 132B are electrically interconnected by interconnect 150B. A series connection between first parallel stack 132A and second parallel stack 132B is provided by interconnect 184, which electrically connects interconnect 150A of first parallel stack 132A with interconnect 148B of second parallel stack 132B. Isolation material 152 may be included to isolate interconnects 148, 150, and 184 from the electrodes that they are not meant to electrically contact and from the P-N junction within the semiconductor substrate.

As noted above, first electrodes 138 of each die 134 are the same type of electrode while second electrodes 140 of each die 134 are the opposite type of electrode. For example, if second electrodes 140 acts as the anode and first electrodes 138 acts as the cathode of their corresponding dice 134, then interconnect 148A, electrically connecting cathodes 138A, 138B, 138C, and 138D, acts as the cathode of first parallel stack 132A, while interconnect 150A, electrically connecting anodes 140A, 140B, 140C, and 140D, act as the anode of first parallel stack 132A. Similarly, interconnect 148B, electrically connecting cathodes 138E, 138F, 138G, and 138H, acts as the cathode of second parallel stack 132B, while interconnect 150B, electrically connecting anodes 140E, 140F, 140G, and 140H, act as the anode of second parallel stack 132B. In such an example, interconnect 184 creates a series connection by electrically connecting the anode of first parallel stack 132A (formed by interconnect 150A and anodes 140A, 140B, 140C, and 140D) with the cathode of second parallel stack 132B (formed by interconnect 148B and cathodes 138E, 138F, 138G, and 138H). The cathode of first parallel stack 132A (formed by interconnect 148A and cathodes 138A, 138B, 138C, and 138D) and the anode of second parallel stack 132B (formed by interconnect 150B and anodes 140E, 140F, 140G, and 140H) may be connected to a circuit comprising a load to be powered by power converter 180. In one example, an electrode contact pad 186 may be deposited on interconnect 148A while a second electrical contact pad 188 may be deposited on interconnect 150B in order to provide a contact location to connect to the load, such as to bond a connecting wire of the circuit or to form a flip chip solder ball.

In one example, an isolation layer 190 is deposited between first parallel stack 132A and second parallel stack 132B to isolate first electrode 138D of first parallel stack 132A from first electrode 138E of second parallel stack 132B. Isolation layer 190 may comprise any material capable of electrically isolating electrodes 138D and 138E. Examples of materials that may be used in isolation layer 166 include dielectric materials, for example sapphire, glass, porcelain, or other ceramics, such as silicon oxide, silicon carbide, silicon nitride, and aluminum oxide.

Figure 6B:
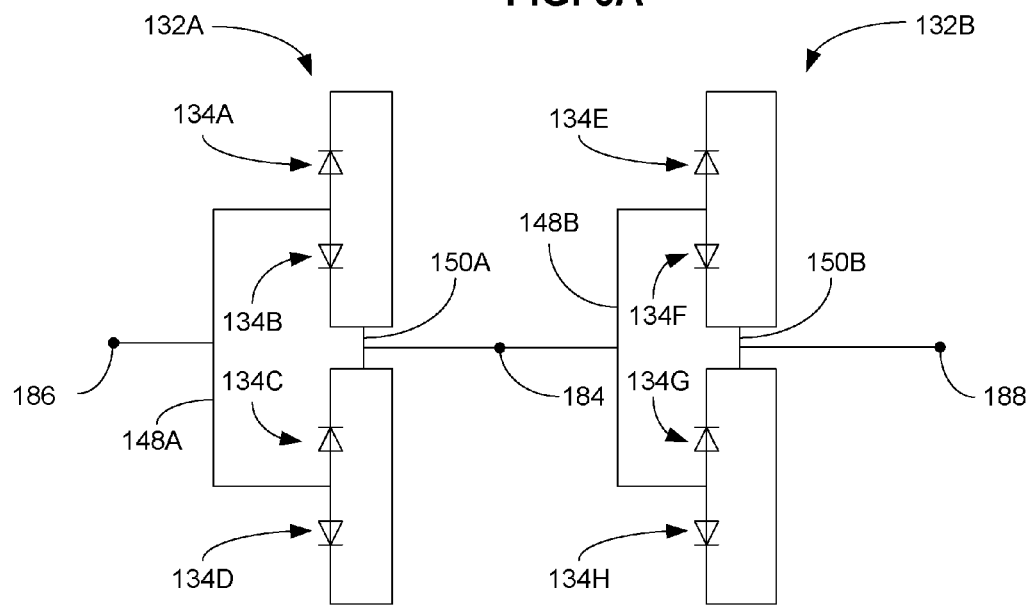
FIG. 6B is a schematic diagram of an equivalent circuit of the example betavoltaic power converter of FIG. 6A.

FIG. 6B shows a schematic circuit diagram of power converter 180 shown in FIG. 6A with each die 134 represented as a diode that is sensitive to beta particles. If it is assumed, as in the examples described above, that each die 134 has a maximum voltage output of x volts and a maximum current output of y amperes, then each parallel stack 132 has a maximum voltage output of x volts and a maximum current output of 4y amperes, as described above with respect to FIGS. 4A and 4B. Combined stack 182 comprising parallel stacks 132A and 132B connected in series would thus have a maximum voltage output of 2x volts and a maximum current output of 4y amperes.

Additional combinations of individual dice, primary stacks, series stacks, and parallel stacks may be provided without varying from the scope of the present disclosure.

Figure 7:
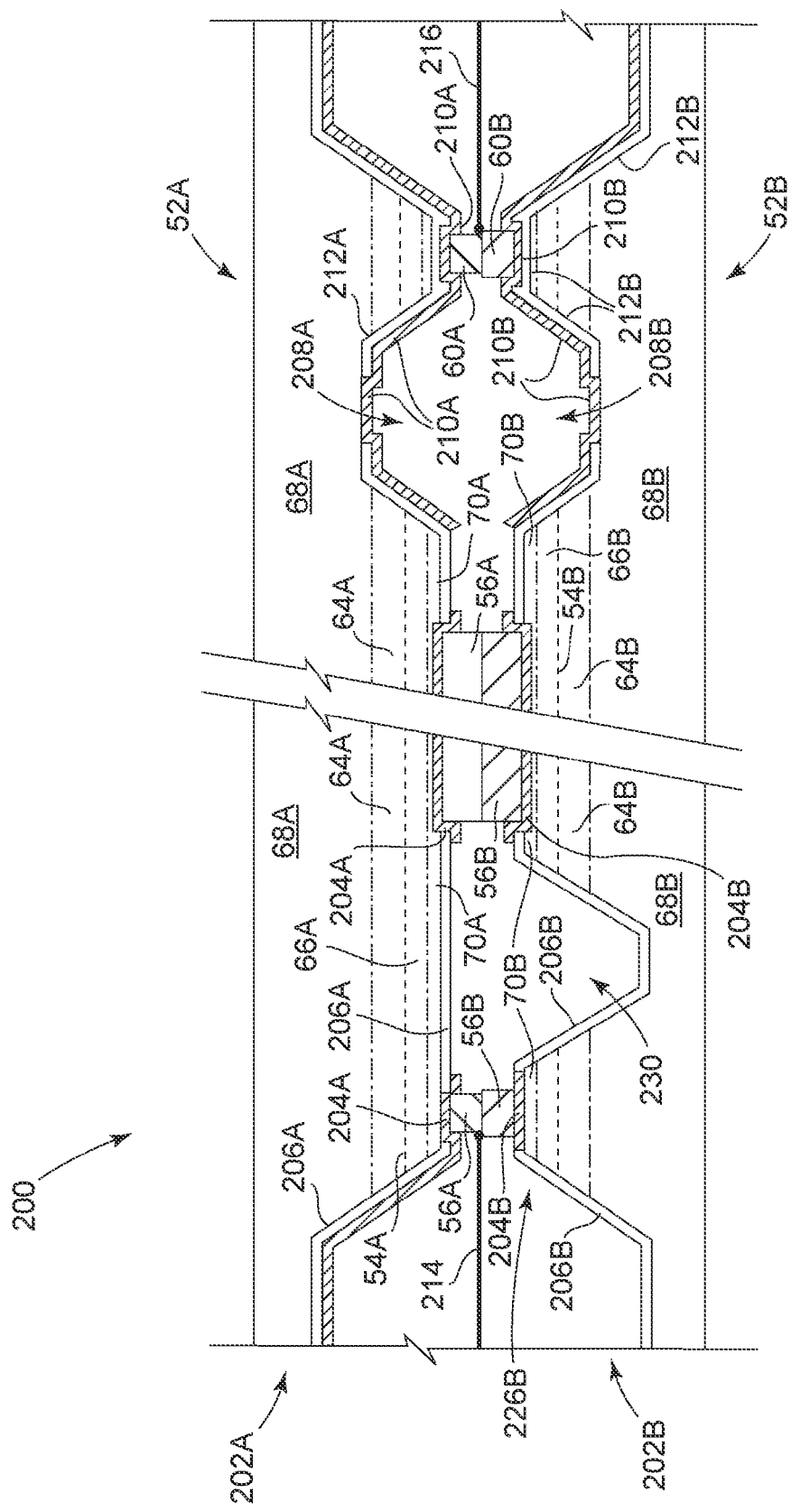
FIG. 7 is a cross section of an example betavoltaic power converter comprising two dice connected in parallel.

FIG. 7 shows cross-sectional view of an example power converter 200 comprising two dice 202A, 202B (collectively referred to herein as "die 202" or "dice 202") stacked in parallel. Each die 202 comprises a semiconductor substrate 52A, 52B (collectively referred to herein as "semiconductor substrate(s) 52") for the collection of electron hole pairs formed due to beta radiation exposure. The example semiconductor substrate 52 of dice 202 shown in FIG. 7 is functionally identical to semiconductor substrate 52 described above with respect to FIG. 2A, and is labeled accordingly. However, it will be recognized that other configurations of the semiconductor substrate and P-N junction are possible, including semiconductor substrate 72 described above with respect to FIG. 2B. Each semiconductor substrate 52 comprises a P-N junction 54A, 54B (collectively referred to herein as "P-N junction(s) 54") between an n– layer 64A, 64B (collectively referred to herein as "n– layer(s) 64") and a p– layer 66A, 66B (collectively referred to herein as "p– layer(s) 66"). Each semiconductor substrate 52 also comprises an n+ layer 68A, 68B (collectively referred to herein as "n+ layer(s) 68") in contact with a respective n– layer 64 and a p+ layer 70A, 70B (collectively referred to herein as "p+ layer(s) 70") in contact with a respective p– layer 66.

Each die 202 also comprises a first electrode 56A, 56B (collectively referred to herein as "first electrode(s) 56") and a second electrode 60A, 60B (collectively referred to herein as "second electrode(s) 60") deposited on semiconductor substrate 52. In the example shown in FIG. 7, each first electrode 56 is electrically connected to p– layer 66 through p+ layer 70 so that first electrodes 56 act as the cathode of each die 202. Each second electrode 60 is electrically connected to n– layer 64 through n+ layer 68 so that second electrodes 60 act as the anode of each die 202. First electrode 56 comprises a beta-emitting radioisotope for the emission of beta particles, such as Nickel-63. As described above, in some examples, second electrode 60 may also comprise a beta-emitting radioisotope, such as Nickel-63. In such an example, n+ layer 68 should be sufficiently thin so that beta particles emitted from second electrode 60 will reach P-N junction 54. In one example, first electrode 56 covers a majority of the surface of one side of semiconductor substrate 52 that is proximate P-N junction 54 so that there is an increased number of beta particles emitted from first electrode 56 into semiconductor substrate 52.

As shown in FIG. 7, first electrode 56 and second electrode 60 may both be deposited on the same side of semiconductor substrate 52, such as on the same side as p+ layer 70, so long as first electrode 56 is electrically connected to p– layer 66 while being isolated from n+ layer 68 and n– layer 64 and second electrode 60 is electrically connected to n– layer 64 while being isolated from p+ layer 70 and p– layer 66.

In the example shown in FIG. 7, the electrical connection between each first electrode 56 and the corresponding p– layer 66 comprises a seed metal 204A, 204B (collectively referred to herein as "seed metal 204") deposited in electrical contact with p+ layer 70, wherein first electrode 56 is deposited on seed metal 204. In one example, seed metal 204 forms an ohmic contact with p+ layer 70 in order to form a conductive path between p+ layer 70 and seed metal 204. In one example, seed metal 204 comprises titanium/nickel or titanium/copper. In one example, first electrode 56 is deposited by electroplating the material of first electrode 56 onto seed metal 204. An electric path is formed from p– layer 66 through p+ layer 70, seed metal 204, and into first electrode 56. Electrical isolation material 206A, 206B (collectively referred to herein as "isolation material 206") is formed over any exposed portions of p– layer 66, n– layer 64, and n+ layer 68 so that seed metal 204 and first electrode 56 are only in electrical contact with p+ layer 70. In one example, isolation material 206 comprises a dielectric, such as an oxide, for example silicon oxide or aluminum oxide, or a nitride, for example silicon nitride.

In the example shown in FIG. 7, a trench 208A, 208B (collectively referred to herein as "trench(es) 208") is formed within each semiconductor substrate 52 through p+ layer 70, p– layer 66, and n– layer 64, exposing a portion of n+ layer 68. First electrode 56 is deposited over a first portion of p+ layer 70 (shown as a left portion in FIG. 7) while second electrode 60 is deposited over a second portion of p+ layer 70 (shown as a right portion in FIG. 7). Second electrode 60 is electrically connected to n+ layer 68 via an electrical conductor passing through trench 208 and forming an electrical contact with n+ layer 68. In one example, the electrical conductor that passes through trench 208 comprises a seed metal 210A, 210B (collectively referred to herein as "seed metal 210") deposited along trench 208 in order to form an electrical contact with n+ layer 68. Electrical isolating material 212A, 212B (collectively referred to herein as "isolating material 212") is deposited between seed metal 210 and p+ layer 70, p– layer 66, and n– layer 64 so that seed metal 210 is electrically isolated from these layers and so that seed metal 210 is only in electrical contact with n+ layer 68. Second electrode 60 is deposited on seed metal 210 in order to electrically connect electrode 60 to n– layer 64 through n+ layer

68, along seed metal 210, and into second electrode 60. In one example, seed metal 210 forms an ohmic contact with n+ layer 68 in order to form a conductive path between n+ layer 68 and seed metal 210. In one example, seed metal 210 comprises titanium/nickel or titanium/copper. In one example, second electrode 60 is deposited by electroplating the material of second electrode 60 onto seed metal 210.

Dice 202A and 202B are connected in parallel by bonding first electrode 56A of first die 202A to first electrode 56B of second die 202B so that first electrodes 56A and 56B are mechanically coupled and electrically connected. Second electrode 60A of first die 202A is also bonded to second electrode 60B of second die 202B so that second electrode 60A is mechanically coupled and electrically connected to second electrode 60B. In one example, first electrodes 56A and 56B are bonded via a solid state bond, such as a diffusion bond. In one example, first electrodes 56A and 56B are both made from the same beta-emitting radioisotope, such as nickel-63. In one example, second electrodes 60A and 60B are bonded via a solid state bond, such as a diffusion bond. In one example, second electrodes 60A and 60B are both made from the same beta-emitting radioisotope, such as nickel-63.

Power converter 200 may also include an electrical connection to first electrodes 56A, 56B, such as connection wire 214 wire bonded to one or both of first electrode 56A or first electrode 56B, and an electrical connection to second electrodes 60A, 60B, such as connection wire 216 wire bonded to one or both of second electrode 60A or second electrode 60B, in order to connect power converter 200 to a circuit comprising a load to be powered. Other connection methods may be used, such as interconnect metal layers to other portions of power converter, or a solder bump for a flip chip arrangement.

Figure 8:
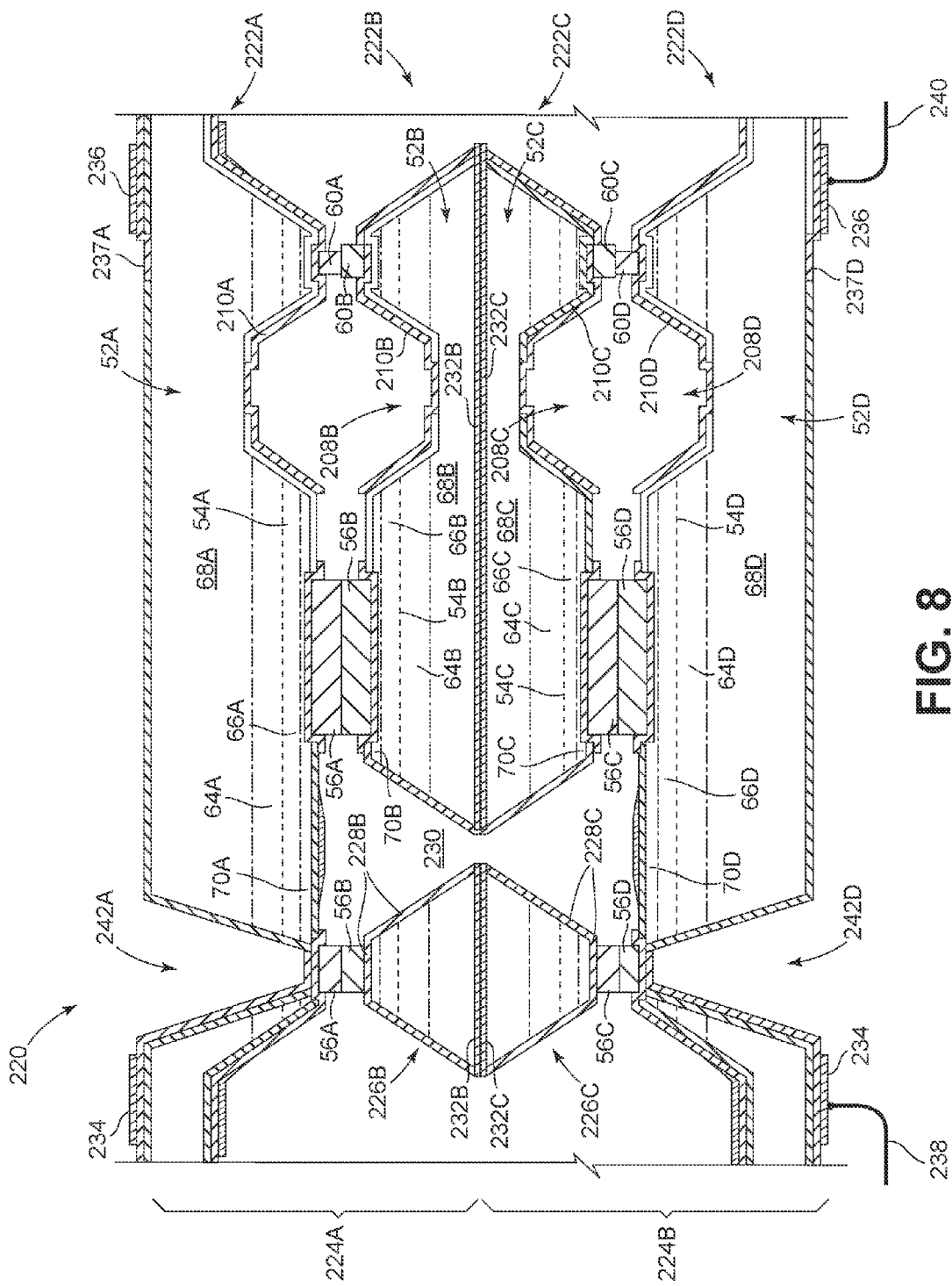
FIG. 8 is a cross section of an example betavoltaic power converter comprising four dice connected in parallel.

FIG. 8 shows a cross section of a power converter 220 comprising four dice 222A, 222B, 222C, 222D (collectively referred to herein as "die 222" or "dice 222") stacked in parallel. Each die shown in FIG. 8 is functionally identical to die 202 as described above with respect to FIG. 7, e.g., comprising a semiconductor substrate 52 with a P-N junction 54 formed between a n− layer 64 and a p− layer 66, with a n+ layer 68 adjacent to n− layer 64 and a p+ layer 70 adjacent to p− layer 66, and a first electrode 56 electrically connected to p− layer 66 through p+ layer 70 and a second electrode 60 electrically connected to n− layer 66 through n+ layer 68. Dice 222 may have a different configuration, such as with a semiconductor substrate configured with the arrangement of semiconductor substrate 72, as described above with respect to FIG. 2B.

Dice 222 are stacked into two primary stacks 224A, 224B (collectively referred to herein as "primary stack(s) 224"), each comprising a pair of dice 222 stacked in parallel. For example, a first primary stack 224A may comprise first die 222A and second die 222B with first electrode 56A of first die 222A bonded to first electrode 56B of second die 222B and with second electrode 60A of first die 222A bonded to second electrode 60B of second die 222B. Second primary stack 224B may comprise third die 222C and fourth die 222D with first electrode 56C of third die 222C bonded to first electrode 56D of fourth die 222B and with second electrode 60C of third die 222C bonded to second electrode 60D of fourth die 222D. The bonds between first electrodes 56 and between second electrodes 60 mechanically couple and electrically connect the bonded electrodes, such as with a diffusion bond. Each primary stack 224 shown in the example of FIG. 8 are functionally identical to the parallel stack formed by dice 202A and 202B as described above with respect to FIG. 7.

Primary stacks 224 are then stacked so that a parallel connection is formed between first primary stack 224A and second primary stack 224B. In the example shown in FIG. 8, an electrical connection is formed through first electrodes 56, and a separate electrical connection is formed through second electrodes 60. In the example shown in FIG. 8, the electrical connection through first electrodes 56 is formed by a post 226B that is formed as part of second die 222B and a corresponding post 226C that is formed as part of third die 222C. An interconnect metal 228B, 228C is deposited onto each post 226B, 226C to form an electrical connection between first electrodes 56B and 56C, which in turn are electrically connected to first electrodes 56A and 56D, respectively. Within each post 226B, 226C, the interconnect metal 228 is in electrical contact with both n− layer 64 and p− layer 66, as well as n+ layer 68 and p+ layer 70, so that within post 226B, 226C, the P-N junction is shorted out, and posts 226B, 226C become, in practice, an electrical interconnect. Post 226B is bonded to post 226C by bonding interconnect metal 232B of post 226B to interconnect metal 232C of post 226C.

Post 226B may be formed after first die 222A and second die 222B are bonded together, followed by thinning second die 222B so that post 226B is bonded to first electrode 56A of first die 222A. In one example, after bonding but before thinning to form post 226B, first die 222A and second die 222B may resemble the cross section described above with respect to FIG. 7, wherein post 226B is formed surrounded by an isolation gap 230 between post 226B and the remainder of semiconductor substrate 52B (FIG. 7). Semiconductor substrate 52B of second die 222B is then thinned all the way to isolation gap 230, such as by grinding it down from the bottom, until post 226 is separated from the remainder of semiconductor substrate 52B. Post 226C of third die 22C may be formed by a similar method.

The electrical connection through second electrodes 60 is formed by forming an electrical connection between n+ layer 68B of second die 222B and n+ layer 68C of third die 222C. As described above with respect to FIG. 7, n+ layer 68A of first die 222A and n+ layer 68B of second die 222B are electrically connected because second electrodes 60A, 60B are bonded and electrically connected, and because each second electrode 60 is electrically connected to its corresponding n+ layer 68 through an electrical conductor passing through a trench 208 in each die 222 that exposes a portion of n+ layer 68, such as a seed metal 210 deposited along trench 208. A similar electrical connection is formed between n+ layer 68C of third die 222C and n+ layer 68D of fourth die 222D. Therefore, the electrical connection between n+ layer 68B of second die 222B and n+ layer 68C of third die 222C provides for a conduction pathway connecting all four second electrodes 60.

In one example, the electrical connection between n+ layer 68B and n+ layer 68C is formed by depositing a contact metal 232B on n+ layer 68B of second die 222B and a contact metal 232C on n+ layer 68C of third die 222C. Contact metal 232B, 232C may form an ohmic contact to n+ layer 68B, 68C. Contact metal 232B of second die 222B is then bonded to contact metal 232C of third die 222C so that an electrical connection is formed between the contact metals 232B and 232C, such as a diffusion bond. Examples of materials that may be used as contact metal 232B, 232C include Ti, TiW, W, Ta, Pt, Pd, Nb, Al, Ni, Ti/Ni, Ti/Au, and Ti/Cu Power converter 220 may also be configured to provide connection points to the circuit comprising the load to be powered by power converter 220. In one example, power converter 220 comprises a contact pad 234 that is electrically connected to first electrodes 56 and a contact pad 236 that is electrically connected to second electrodes 60.

In one example, contact pad 234 is electrically connected to first electrodes 56 by a via, sometimes referred to as a through semiconductor via ("TSV"), provided through one or more dice 222 that provides for electrical connection from one side of a semiconductor substrate 52 to the other. In the example shown in FIG. 8, dice 222A and 222D each comprise a TSV 242A, 242D in order to provide an electrical connection from the outside of power converter 220 to first electrodes 56. TSVs 242A and 242D allow contact pad 234 to be place on a side opposite to first electrodes 56 while still provided for an electrical contact to first electrodes 56.

In one example, contact pad 236 is electrically connected to second electrodes 60 through the n+ layer 68 of one or more dice 222. In one example, shown in FIG. 8, a contact metal 237A is placed in electrical contact with n+ substrate 68A of first die 222A and contact metal 237D is placed in electrical contact with n+ substrate 68D of fourth die 222D and a contact pad 236 is deposited on contact metal 237A, 237D. As described above, n+ substrate 68A of first die 222A is electrically connected to electrode 60A, which is electrically connected to electrode 60B. Similarly, n+ substrate 68D of fourth die 222D is electrically connected to electrode 60D, which is electrically connected to electrode 60C. Electrodes 60B and 60D are electrically connected through n+ substrates 68B and 68C and through contact metal 232B, 232C, as shown in FIG. 8.

As noted above, in the arrangement shown in FIG. 8, first electrodes 56 act as the cathode for each die 222, while second electrodes 60 act as the anode for each die 222. In such an arrangement, contact pad 234 will act as the cathode of power converter 220 while contact pad 236 will act as the anode. Contact pads 234, 236 may be connected to the circuit by electrical connectors, such as connection wires 238, 240, or by flip chip solder bumps The equivalent circuit of power converter 220 as described above with respect to FIG. 8 is identical to that shown in FIG. 4B for example power converter 130 of FIG. 4A.

Figure 9A:
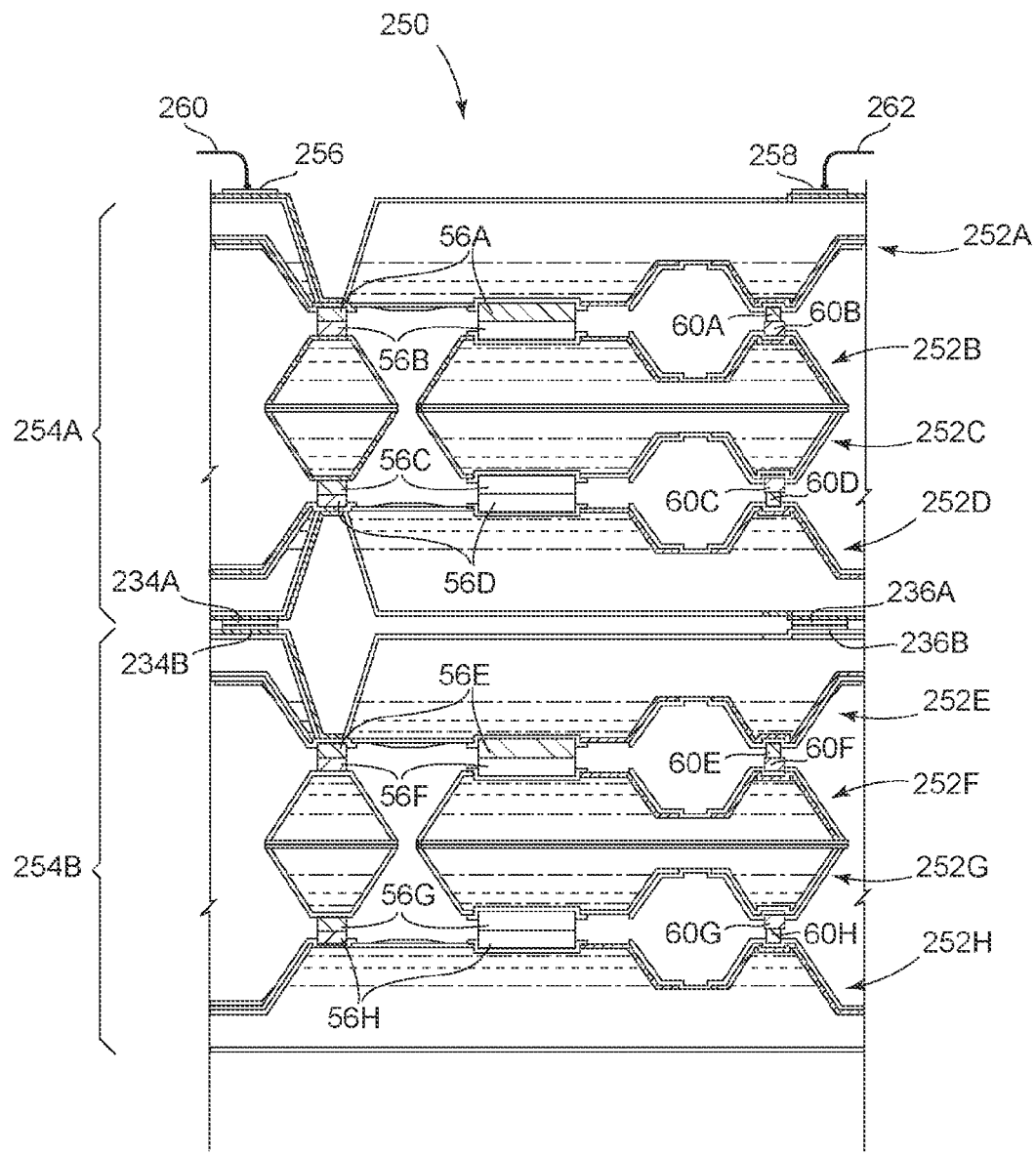
FIG. 9A is a cross section of an example betavoltaic power converter comprising eight dice connected in parallel.

FIG. 9A is a cross sectional view of a power converter 250 comprising eight dice 252A, 252B, 252C, 252D, 252E, 252F, 252G, 252H (collectively referred to herein as "die 252" or "dice 252") connected in parallel. Dice 252 are arranged into two parallel stacks 254A, 254B (collectively referred to herein as "parallel stack(s) 254"), wherein each parallel stack 254 is functionally identical to power converter 220 described above with respect to FIG. 8. Parallel stack 254A is connected in parallel to parallel stack 254B, such as by bonding contact pad 234A of first parallel stack 254A to contact pad 234B of second parallel stack 254B and by bonding contact pad 236A of first parallel stack 254A to contact pad 236B of second parallel stack 254B. In one example, the bond between contact pads 234A and 234B and between contact pads 236A and 236B is a diffusion bond that mechanically couples and electrically connects the bonded contact pads. The electrical connection between contact pads 234A and 234B and between contact pads 236A and 236B creates a parallel connection between first parallel stack 254A and second parallel stack 254B.

Power converter 250 may also be configured to provide for connection points to the circuit comprising the load to be powered by power converter 250. In one example, power converter 250 comprises a contact pad 256 that is electrically connected to first electrodes 56, such as through a via (described above with respect to FIG. 8), and a contact pad 258 that is electrically connected to second electrodes 60, such as through a contact metal (described above with respect to FIG. 8). In one example, described above with respect to FIG. 8, first electrodes 56 act as the cathode for each die 252, while second electrodes 60 act as the anode for each die 252. In such an arrangement, contact pad 256 will act as the cathode of power converter 250 while contact pad 258 will act as the anode. Contact pads 256, 258 may be connected to the circuit by electrical connectors, such as connection wires 260, 262, or by flip chip solder bumps.

Figure 9B:
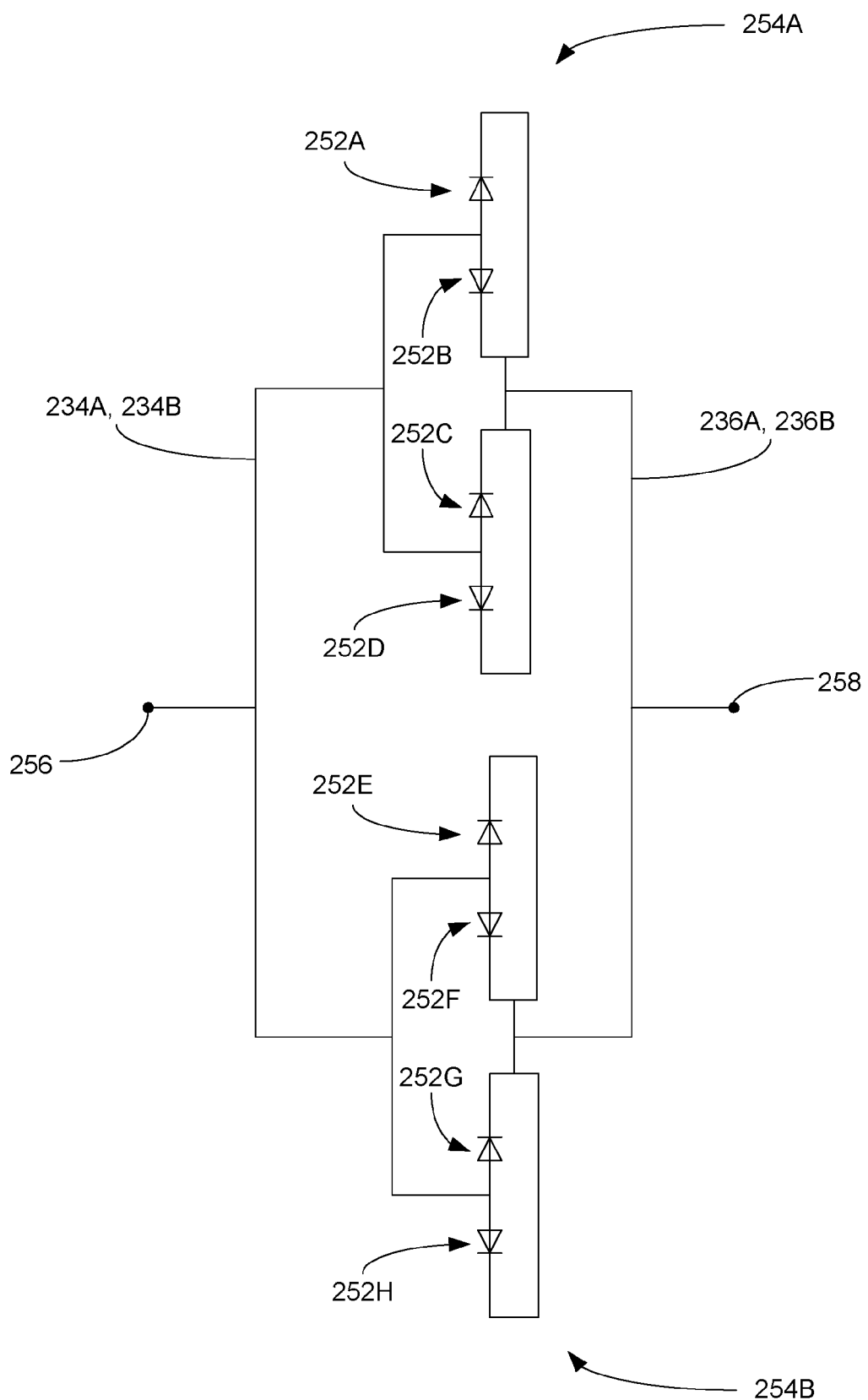
FIG. 9B is a schematic diagram of an equivalent circuit of the example betavoltaic power converter of FIG. 9A.

FIG. 9B shows a schematic equivalent circuit diagram of power converter 250 as described above with respect to FIG. 9A.

Figure 10:
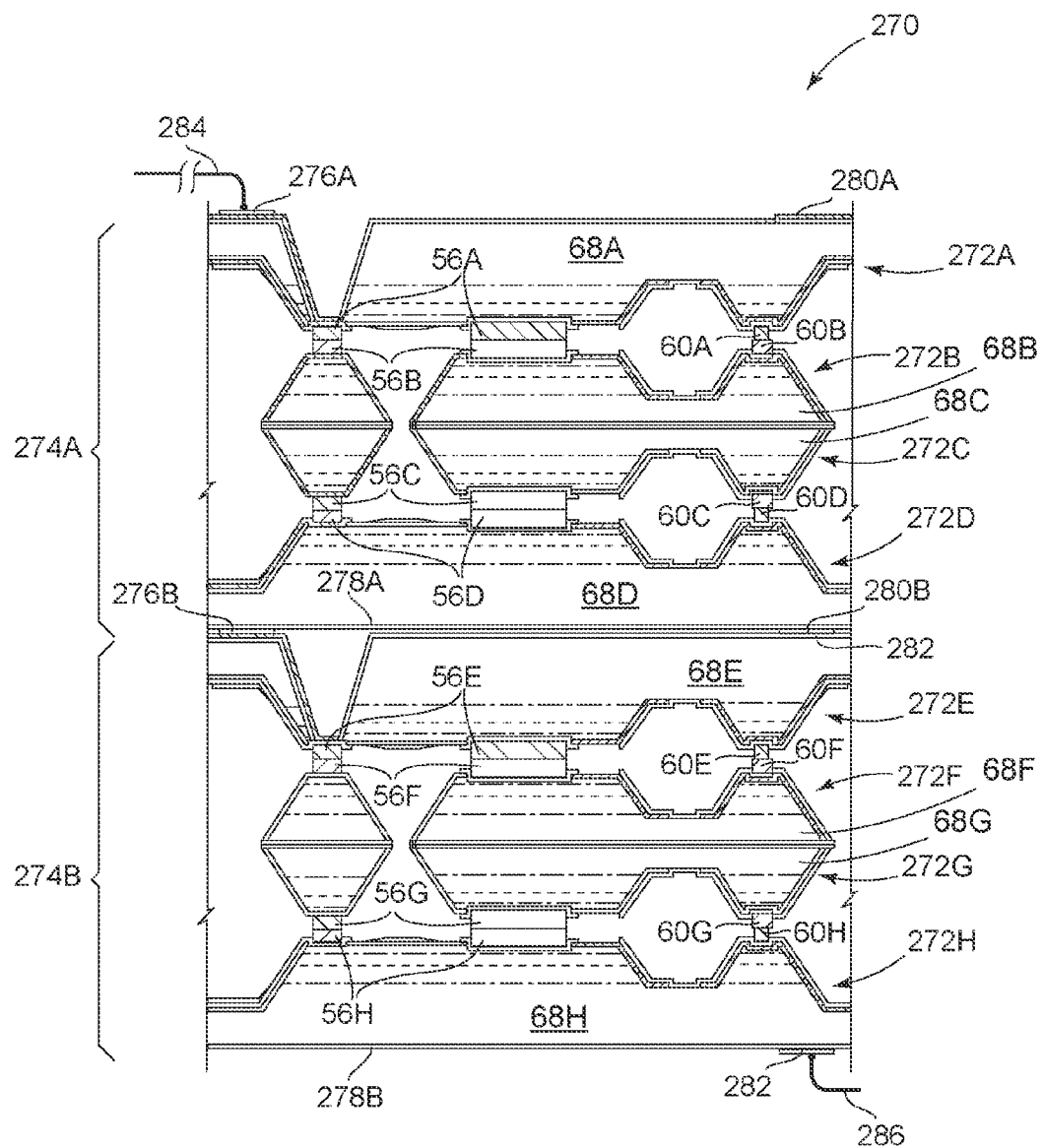
FIG. 10 is a cross section of an example betavoltaic power converter comprising two parallel stacks connected in series, each parallel stack comprising four dice connected in parallel.

FIG. 10 shows a cross sectional view of a power converter 270 comprising eight dice 272A, 272B, 272C, 272D, 272E, 272F, 272G, 272H (collectively referred to herein as "die 272" or "dice 272"). Dice 272 are arranged into two parallel stacks 274A, 274B (collectively referred to herein as "parallel stack(s) 274"), wherein first parallel stack 274A is connected in series to second parallel stack 274B. Each parallel stack 274 is functionally similar to parallel stacks 254 described above with respect to FIG. 9A, except that fourth die 272D and eighth die 272H do not comprise a TSV, as do fourth die 252D and eight die 252H as shown in FIG. 9A, because there is no need for an electrical connection between first electrodes 56A, B, C, D of first parallel stack 274A and first electrodes 56E, F, G, H of second parallel stack 274B.

In one example, first parallel stack 274A comprises a first contact pad 276A that is electrically connected to first electrodes 56A, B, C, D of first parallel stack 274A. First parallel stack 274A also comprises a contact metal 278A deposited onto fourth die 272D, wherein contact metal 278A is electrically connected to n+ layer 68D of fourth die 272D, such as via an ohmic contact, and thus is electrically connected to second electrodes 60A, B, C, D of first parallel stack 274A. Second parallel stack 274B comprises a contact pad 276B that is electrically connected to first electrodes 56E, F, G, H of second parallel stack 274B. Second parallel stack 274B also may comprise a contact metal 278B deposited onto eighth die 272H, wherein contact metal 278B is electrically connected to n+ layer 68H of eighth die 272H, such as via an ohmic contact, and thus is electrically connected to second electrodes 60E, F, G, H of second parallel stack 274B. A series connection is created between first parallel stack 274A and second parallel stack 274B by electrically connecting contact metal 278A of first parallel stack 274A (electrically connected to second electrodes 60 of first parallel stack 274A) to contact pad 276B of second parallel stack (electrically connected to first electrodes 56 of second parallel stack 274B). In one example, contact metal 278A is bonded to contact pad 276B to form a mechanical coupling and an electrical connection, such as with a diffusion bond.

In one example, each parallel stack 274A, 274B may also comprise a mechanical coupling pad 280A, 280B in order to provide an additional contact point for mechanical coupling between parallel stacks 274A, 274B or for coupling power converter 270 to another work piece, such as a circuit board. For example, as shown in FIG. 10, second parallel stack 274B comprises a coupling pad 280B over n+ layer 68E, wherein coupling pad 280B is mechanically coupled to contact metal 278A of first parallel stack 274A. However, because power converter 270 comprises a series connection between first parallel stack 274A and second parallel stack 274B, contact metal 278A of first parallel stack 274A must be electrically isolated from n+ layer 68E in order to isolate second electrodes 60A, B, C, D of first parallel stack 264A from second electrodes 60E, F, G, H of second parallel stack 274B. In one example, an electrically insulating material 282 is deposited between n+ layer 68E and coupling pad 280B in order to electrically isolate n+ layer 68E from coupling pad 280B. In another example, the coupling between coupling pad 280B and contact metal 278A may comprise a non-electrically conducting method of coupling, such as through the use of a non-conducting adhesive. In yet another example, coupling pad 280B may comprise an electrically insulating material.

Power converter 270 may also comprise a contact pad 282 that is electrically connected to second electrodes 60E, F, G, H of second parallel stack 274B via contact metal 278B and n+ layer 68H in order to provide a connection point to the circuit comprising the load to be powered by power converter 270. In one example, contact pad 276A that is electrically connected to first electrodes 56A, B, C, D of first parallel stack 274A and contact pad 282 are both used to connect to the circuit, such as through connection wires 284, 286. In one example, first electrodes 56 act as the cathode for each die 272, while second electrodes 60 act as the anode for each die 272. In such an arrangement, contact pad 276A (electrically connected to first electrodes 56A, 56B, 56C, 56D) will act as the cathode of first parallel stack 274A while contact metal 278A (electrically connected to second electrodes 60A, 60B, 60C, 60D) will act as the anode of first parallel stack 274A. Similarly, contact pad 276B (electrically connected to first electrodes 56E, 56F, 56G, 56H) will act as the cathode of second parallel stack 274B while contact metal 278B and contact pad 282 (electrically connected to second electrodes 60E, 60F, 60G, 60H) will act as the anode of second parallel stack 274B. Because contact metal 278A of first parallel stack 274A is electrically connected to contact pad 276B of second parallel stack 274B, contact pad 276A will act as the cathode for the entire power converter 270, while contact metal 278B and contact pad 282 will act as the anode for power converter 270.

The equivalent circuit of power converter 270 is identical to that shown in FIG. 6B for example power converter 180 of FIG. 6A.

Figure 11:
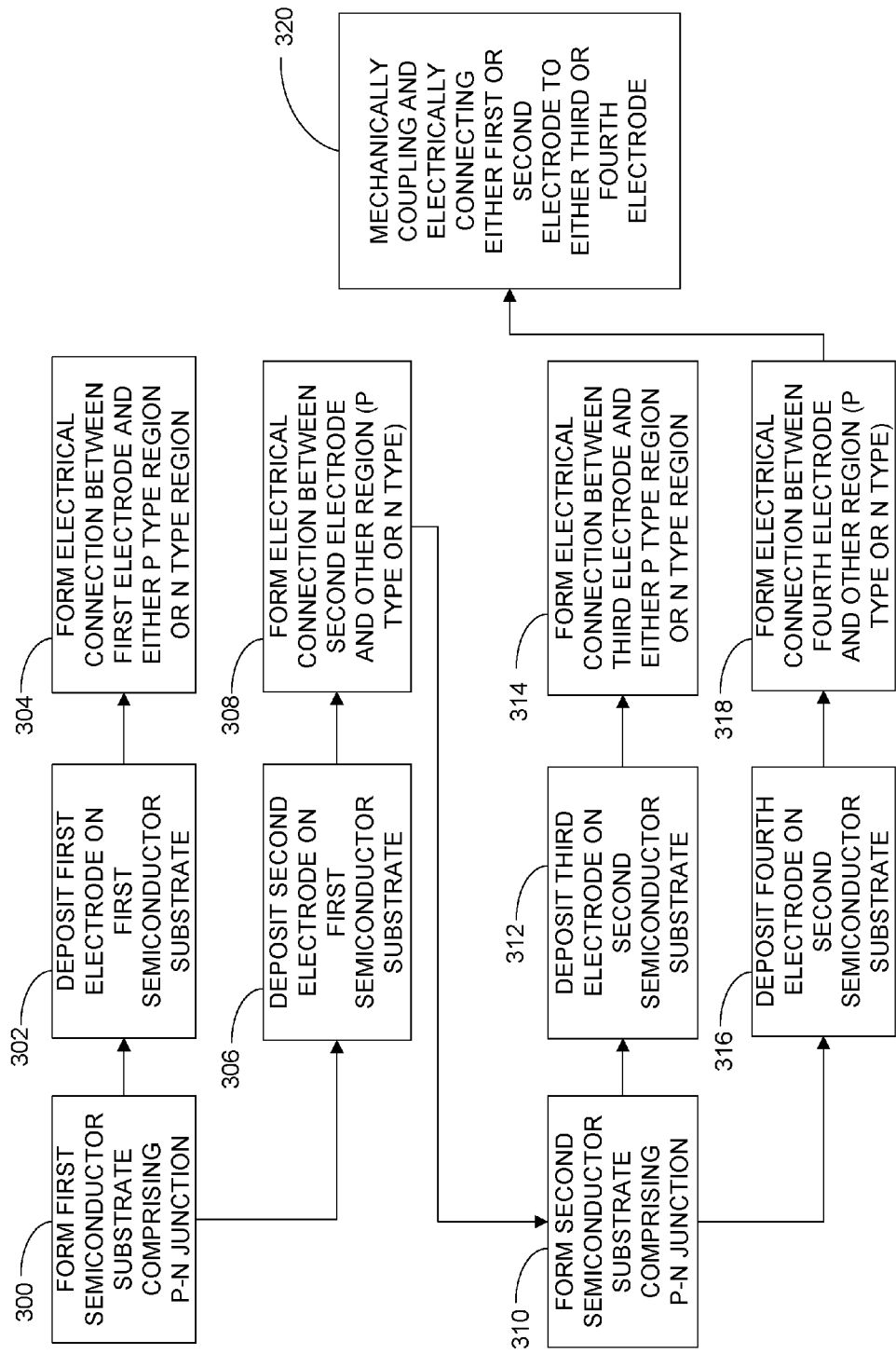
FIG. 11 is a flow chart showing an example method of making a betavoltaic power converter.

FIG. 11 is a flow chart illustrating an example method of making a power converter in accordance with the present disclosure. The example method of FIG. 11 will be described with respect to the formation of power converters 200, 220, 250, and 270 described above with respect to FIGS. 7-10. The example method is not limited to these power converters, however, and the example method may be performed to make other betavoltaic power converters in accordance with the teachings of the present disclosure. The example method of FIG. 11 comprises forming a first semiconductor substrate 52A comprising a P-N junction 54A (300), with a p type region 66A on a P side of P-N junction 54A and an n type region 64A on an N side of P-N junction 54A. A first electrode 56A comprising a beta-emitting radioisotope is deposited on first semiconductor substrate 52A (302) and an electrical connection is formed between first electrode 56A and either p type region 66A or n type region 64A (304). A second electrode 60A is deposited on first semiconductor substrate 52A (306) and an electrical connection is formed between second electrode 60A and the other of p type region 66A and n type region 64A (308). As described above, in the example power converter 200, 220, 250, and 270, first electrode 56A is electrically connected to p type region 66A and second electrode 60A is electrically connected to n type region 64A. First electrode 56A may be deposited before second electrode 60A, second electrode may be formed before first electrode 56A, or first electrode 56A and second electrode 60A may be deposited substantially simultaneously.

A second semiconductor substrate 52B comprising a P-N junction 54B is also formed (310) with a p type region 66B on a P side of P-N junction 54B and an n type region 64B on an N side of P-N junction 54A. A third electrode 56B comprising a beta-emitting radioisotope is deposited on semiconductor substrate 52B (312) and an electrical connection is formed between third electrode 56B and either p type region 66B or n type region 64B (314). A fourth electrode 60B is deposited on second semiconductor substrate 52B (316) and an electrical connection is formed between fourth electrode 60B and the other of p type region 66B or n type region 64B (318). As described above, in one example, third electrode 56B is connected to the same type of region of second semiconductor substrate 52B as the type of region of first semiconductor substrate 52A that first electrode 56A is connected to. As described above, in example power converters 200, 220, 250, and 270, third electrode 56B is electrically connected to p type region 66B and fourth electrode 60B is electrically connected to n type region 64B. Third electrode 56B may be deposited before fourth electrode 60B, fourth electrode 60B may be deposited before third electrode 56B, or third electrode 56B and fourth electrode 60B may be deposited substantially simultaneously. Although steps 300-308 are described and shown as taking place before steps 310-318, this order can be reversed.

After both first semiconductor substrate 52A and second semiconductor substrate 52B are formed (300, 310), electrodes 56A, 56B, 60A, 60B are deposited (302, 306, 312, 316), and electrical connections are formed between the electrodes and the desired regions 64A, 64B, 66A, 66B of semiconductor substrates 52A, 52B (304, 408, 314, 318), a bond is formed between either first electrode 56A or second electrode 60A and either third electrode 56B or fourth electrode 60B, mechanically coupling and electrically connected the bonded electrodes (320). As described above, example power converters 200, 220, 250, and 270 show electrode 56A of first semiconductor substrate 52A being bonded to electrode 56B of second semiconductor substrate 452B and show electrode 60A of first semiconductor substrate 52A bonded to electrode 60B of second semiconductor substrate 60B in order to form a parallel connection between first semiconductor substrate 52A and second semiconductor substrate 52B.

Forming first semiconductor substrate 52A (300) and forming second semiconductor substrate 52B (310) may comprise forming each semiconductor substrate 52A by epitaxially growing layers of the substrate onto a base layer. In the example shown in FIG. 7, each semiconductor substrate 52A, 52B may be formed by first forming an n+ base layer 68 comprising an n+ semiconductor material, as described above. Next, n– layer 64 may be epitaxially deposited on n+ layer 68 so that n– layer 64 has the same crystal orientation as n+ layer 68. A p– layer 66 may be epitaxially deposited on n– layer 64 so that p– layer has the same crystal orientation as n– layer 64 and n+ layer 68. Next, a thin p+ layer may be epitaxially deposited on p– layer so that p+ layer has the same crystal orientation as p– layer 66, n– layer 64, and n+ layer 66. The orientation of the layers of the semiconductor substrates may be reversed so that each substrate has the configuration of semiconductor substrate 72 described above with respect to FIG. 2B, e.g., providing a p+ base layer 88, epitaxially depositing a p– layer 86 on p+ layer 88, epitaxially depositing a n– layer 84 on p– layer 86, and epitaxially growing a n+ layer 90 on n– layer 84.

After layers 64, 66, 68, 70 of semiconductor substrates 52A, 52B are formed, forming substrates 52A, 52B (300, 310) may also comprise patterning substrates 52A, 52B to form structures that provided for desired electrical connection and isolation within the power converter. In one example, semiconductor substrates 52A, 52B are patterned to form the locations where electrodes 56A, 56B, 60A, and 60B will be deposited. Patterning may also be used to form conduction pathways into or through a semiconductor substrate, such as to form trenches 208 in order to electrically connect electrodes 60A, 60B to n+ substrates 68A, 68B, respectively (FIG. 7), or to form TSVs 242A, 242D (FIG. 8). Patterning may also remove material to provide for electrical isolation, such as isolation gap 230 (FIGS. 7 and 8). When the substrates are each a wafer comprising a plurality of dice, described in more detail below, patterning the substrates may comprise forming scribe lines at the periphery of each dice to aide dicing of the wafers.

Patterning substrates 52A, 52B may comprise depositing a photoresist or hardmask on each semiconductor substrate 52A, 52B in a pattern so that the portions of each substrate 52A, 52B to be removed are exposed to an etching method, such as plasma etching, chemical (wet) etching, dry etching, and the like. In one example, first substrate 52A is patterned to form locations for the deposition of electrodes 56A and 60A and to form trench 208A by first depositing a photoresist onto first substrate 52A, etching away the structures needed to form the electrode deposition locations and trench 208A, and then striping the photoresist from first substrate 52A in order to allow for further processing. In one example, second substrate 52B is patterned to form locations for electrodes 56B, 60B and to form isolation gap 230 and trench 208B by depositing a photoresist onto second substrate 52B, etching away the structures needed to form the electrode deposition locations, isolation gap 230, and trench 208B, and then striping the photoresist from second substrate 52B in order to allow for further processing. Patterning of individual structures may be performed as part of individual patterning steps. For example, one patterning step may comprise patterning the locations for electrodes, and a separate patterning step may comprise patterning the location of trench 208 or isolation gap 230.

After desired structures are formed in the semiconductor material of substrates 52A, 52B, electrical isolation material may be deposited onto selective portions of substrates 52A, 52B in order to electrically isolate portions of substrates 52A, 52B from other portions. For example, as described above with respect to FIG. 7, isolation material 206B is deposited over portions of p– layer 66, n– layer 64, and n+ layer 68 proximate electrodes 56A and 56B so that seed metal 204A, 204B and electrode 56A, 56B are only in electrical contact with p+ layer 70A, 70B. Similarly, isolating material 212A and 212B is deposited between seed metal 210A, 210B and p+ layer 70A, 70B, p– layer 66A, 66B, and n– layer 64A, 64B so that seed metal 210A, 210B is only in electrical contact with n+ layer 68A, 68B. In one example, the isolation material may comprise silicon oxide, silicon nitride, and aluminum oxide.

In one example, depositing an isolation material may comprise using a deposition technique to deposit the isolation material onto semiconductor substrate 52A, 52B, such as by chemical vapor deposition of silicon oxide or silicon nitride. Depositing the isolation material may also comprise growing the isolation material on a portion of semiconductor substrate 52A, 52B, such as by thermal oxidation or thermal nitridation of the semiconductor material of semiconductor substrate 52A, 52B. In one method, an isolation material, such as a dielectric, is deposited over the entire surface of each semiconductor substrate 52A, 52B. Then, the isolation material is patterned to remove portions of isolation material to expose selected portions of semiconductor substrate 52A, 52B, such as the locations of electrodes 56A, 56B, 60A, 60B and the point of electrical connection to n+ layer 68A, 68B.

Patterning of the isolation material may comprise depositing a photoresist or hardmask material in a pattern that exposes the portions of isolation material that are to be removed, etching away the exposed isolation material, such as via plasma etching, chemical (wet) etching, or dry etching, and stripping the photoresists or hardmask material away for further processing.

Depositing electrodes 56A and 60A onto first semiconductor substrate 52A (302, 306) and depositing electrodes 56B and 60B onto second semiconductor substrate 52B (312, 316) comprises depositing the material of electrodes 56A, 56B, 60A, 60B onto substrates 52A, 52B so that an electrical connection can be formed between electrodes 56A, 56B and p– layer 66A, 66B through p+ layer 70A, 70B and between electrodes 60A, 60B and n– layer 64A, 64B through n+ layer 68A, 68B. In one example, depositing electrodes 56A, 56B (302, 312) comprises depositing a seed metal 204A, 204B onto p+ layer 70A, 70B, and then electroplating the material of electrodes 56A, 56B onto seed metal 204A, 204B. The material of seed metal 204A, 204B provides for an electrical connection to p+ layer 70A, 70B, such as an ohmic contact, and allows for electroplating of the material of electrodes 56A, 56B. In one example, seed metal 204A, 204B comprises Ti/Ni in order to allow for electroplating of Nickel-63. Other materials that may be used as seed metal 204A, 204B include Ti/Cu, Ti/Au, TiW, and Ti. In one example, depositing electrodes 60A, 60B (306, 316) comprises first depositing a seed metal 210A, 210B onto n+ layer 68A, 68B, such as through an opening in isolation material 212A, 212B in trench 208A, 208B, followed by electroplating electrodes 60A, 60B onto seed metal 210A, 210B. As shown in FIG. 7, seed metal 210A, 210B is deposited onto n+ layer 68A, 68B through the opening in isolation material 212A, 212B and seed metal 210A, 210B also is deposited up a side of trench 208A, 208B so that seed metal 210A, 210B acts as an electrical conductor passing through the trench to connect electrodes 60A, 60B to n+ layer 68A, 68B. As described above, in one example, all of electrodes 56A, 56B, 60A, 60B comprise a beta-emitting radioisotope, such as Nickel-63. Thus, in one example, seed metal 210A, 210B also comprises Ti/Ni, Ti/Cu, Ti/Au, TiW, and Ti in order to allow for electroplating of Nickel-63.

In one example, electroplating of the material of electrodes 56A, 56B, 60A, 60B comprises depositing a blocking layer, such as a photoresist or hardmask, in a pattern that exposes the locations on substrate 52A, 52B where electrodes 56A, 56B, 60A, 60B will be electroplated. In one example, both electrode 56A and electrode 60A are deposited onto first semiconductor substrate 52A as part of the same process step, wherein the blocking material exposes the locations of electrodes 56A and 60A so that the electroplating step forms both electrodes 56A, 60A. Electrodes 56A and 60A may be deposited onto first semiconductor substrate 52A at different process steps, however, such as if electrode 56A and 60A comprise different materials. The deposition of seed metal 204A, 204B also provides for the formation of an electrical connection between electrodes 56A, 56B and p+ layer 70A, 70B (304) while the deposition of seed metal 210A, 210B provides for the formation of an electrical connection between electrodes 60A, 60B and n+ layer 68A, 68B (314).

In one example, both electrode 56B and electrode 60B are deposited onto second semiconductor substrate 52B as part of the same process step, wherein the blocking material exposes the locations of electrodes 56B and 60B so that the electroplating step forms both electrodes 56B, 60B. Electrodes 56B and 60B may be deposited onto second semiconductor substrate 52B at different process steps, however, such as if electrode 56A and 60A comprise different materials. After electroplating electrodes 56A, 56B, 60A, 60B, the blocking layer is stripped away. The process may also comprise patterning and removing portions of seed metal 204A, 204B, 210A, 210B in order to expose isolation material 206A, 206B, 212A, 212B, such as by the photolithography methods described above.

After forming and patterning semiconductor substrates 52A, 52B (300, 310), including patterning the semiconductor material of substrates 52A, 52B and depositing and patterning isolation material 206A, 206B, 212A, 212B, and after depositing and patterning electrodes 56A, 56B, 60A, 60B (302, 306, 312, 316) and forming electrical connections between electrodes 56A, 56B and p+ layer 70A, 70B (304, 314) and between electrodes 60A, 60B and n+ layer 68A, 68B (308, 318), the method comprises forming a bond between electrode 56A or 60A and electrode 56B or 60B (320). As described above, in the example power converters 200, 220, 250, 270, electrode 56A deposited on first semiconductor substrate 52A is bonded to electrode 56B deposited on second semiconductor substrate 52B, while electrode 60A deposited on first semiconductor substrate 52A is bonded to electrode 60B deposited on second semiconductor substrate 52B. The bond mechanically couples and electrically connects the bonded electrodes.

In one example, forming the bond between electrodes 56A and 56B and the bond between electrodes 60A and 60B (320) comprises positioning first semiconductor substrate 52A and second semiconductor substrate 52B so that electrodes 56A and 56B are properly aligned and so that electrodes 60A and 60B are properly aligned. Next, the bond is formed between electrodes 56A and 56B and between electrodes 60A and 60B. The bond may be formed by any of the bonding methods described above, including welding, solid-state bonding, or through the use of an adhesive along with a conduction pathway, such as conductive filler. In one example, diffusion bonds are formed by forcing electrodes 56A and 56B and by forcing electrodes 60A and 60B together at an elevated pressure and an elevated temperature in order to form the diffusion bond.

The example method described above may be performed to make two or more dice 202A, 202B that are bonded together to form power converter 200. Alternatively, the example method described above may be performed to make two or more wafers, wherein each wafer can be diced into individual dice 202 after the completion of the method. In such a case, the method will make a plurality of power converters after the wafers have been diced, rather than a single power converter.

Figure 12:
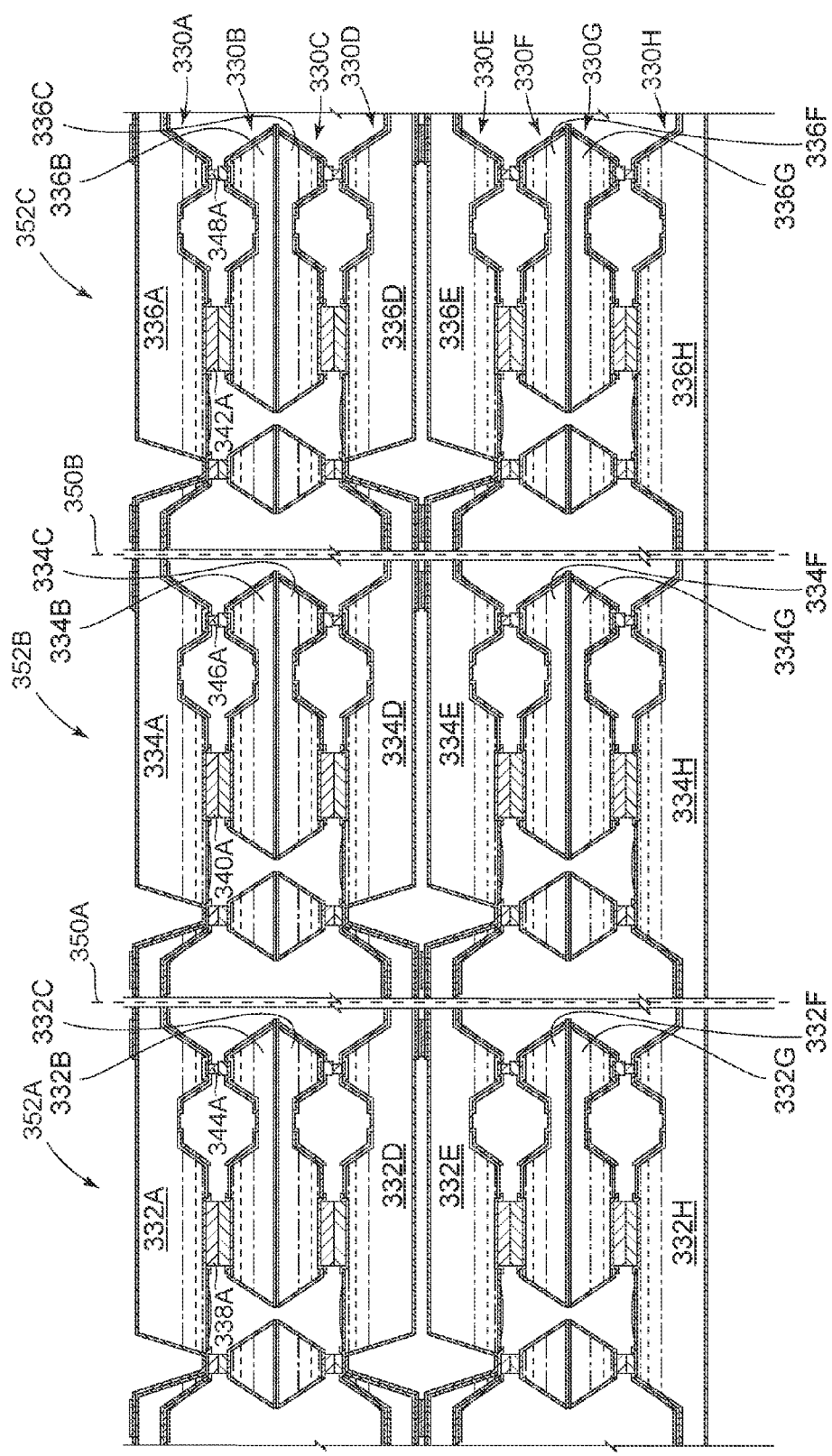
FIG. 12 is a cross second of an example set of eight wafer substrates each comprising a plurality of dice for forming a plurality of betavoltaic power converters.

For example, rather than semiconductor substrates 52A and 52B each being only for the creation of a single die 202, the semiconductor substrates may each form a wafer, wherein each wafer comprises a plurality of dice. FIG. 12 shows an example comprising eight separate semiconductor substrates 330A, 330B, 330C, 330D, 330E, 330F, 330G, 330H (collectively referred to herein as "semiconductor substrate(s) 330"), wherein each substrate 330 forms a wafer comprising a plurality of dice. The example of FIG. 12 shows each wafer substrate 330 comprising three individual dice 332, 334, 336 (for example, wafer substrate 330A comprises individual dice 332A, 334A, and 336A, wafer substrate 330B comprises dice 332B, 334B, and 336B, and so on for the remaining substrates). In practice, however, each wafer substrate 330 may comprise dozens or hundreds of individual dice.

When forming substrates that are meant to be wafers 330 rather than individual dice, each step of the example method described above, after formation of wafer substrates 330, is performed at the location of each individual die 332, 334, 226. For example, depositing a first electrode on the first semiconductor substrate (302) may comprise depositing a plurality of first electrodes, with at least one first electrode being deposited at a location of each individual die. In the example shown in FIG. 12, depositing the first electrode on first semiconductor substrate 330A (302) may comprise depositing an electrode 338A on wafer substrate 330A at the location of die 332A, depositing an electrode 340A on wafer substrate 330A at the location of die 334A, and depositing an electrode 342A on wafer substrate 330A at the location of die 336A, wherein each electrode 338A, 340A, and 342A may be considered a "first electrode" that is deposited in accordance with step 302. Similarly, depositing a second electrode on first semiconductor substrate 330A (306) may comprise depositing electrode 344A on wafer substrate 330A at the location of die 332A, depositing electrode 346A on wafer substrate 330A at the location of die 334A, and depositing electrode 348A on wafer substrate 330A at the location of die 336A, wherein each electrode 344A, 346A, and 348A may be considered a "second electrode" that is deposited in accordance with step 306.

Once each step of the method described above is performed for all dice 330, 332, and 334, wafers 330 may be diced, such as by die cutting along scribe lines 350A, 350B. Dicing causes each wafer substrate 330 to be cut into its individual dice 330, 332, and 334. However, since dice corresponding to a particular power converter have been bonded together, dicing forms individual power converters. For example, dicing of wafers 330A-H shown in FIG. 12 forms a first power converter 352A comprising eight dice 332A-H connected to each other in parallel, a second power converter 352B comprising eight dice 334A-H connected in parallel, and a third power converter 352C comprising eight dice 336A-H connected in parallel.

This disclosure refers to illustrative examples that are not meant to be construed in a limiting sense. Various modifications of the illustrative examples, as well as additional examples in line with the disclosure, will be apparent to persons skilled in the art upon reference to this description. Any specific numerical value or range described in the foregoing disclosure shall not be limiting, except for values or ranges included in the following claims.

The invention claimed is:

1. A power converter comprising:
   a first die comprising:
      a semiconductor substrate comprising a junction for converting nuclear radiation particles to electrical energy, the junction comprising a first side and a second side;
      a first electrode comprising a nuclear radiation-emitting radioisotope deposited on the semiconductor substrate, the first electrode being electrically connected to the first side of the junction; and
      a second electrode deposited on the semiconductor substrate, the second electrode being electrically connected to the second side of the junction;
   a second die comprising:
      a semiconductor substrate comprising a junction for converting nuclear radiation particles to electrical energy, the junction of the second die comprising a first side and a second side;
      a first electrode comprising a nuclear radiation-emitting radioisotope deposited on the semiconductor substrate of the second die, the first electrode of the second die being electrically connected to the first side of the junction of the second die; and
      a second electrode deposited on the semiconductor substrate of the second die, the second electrode being electrically connected to the second side of the junction of the second die; and
   a bond between one of the first electrode or the second electrode of the first die and one of the first electrode or the second electrode of the second die, wherein the bond forms an electrical contact between the bonded electrodes.

2. The power converter of claim 1, wherein the nuclear radiation-emitting radioisotope of the first electrode of the first die comprises at least one of nickel-63, promethium-147, or scandium tritide.

3. The power converter of claim 1, wherein the nuclear radiation-emitting radioisotope of the first electrode of the second die comprises at least one of nickel-63, promethium-147, or scandium tritide.

4. The betavoltaic power converter of claim 1, wherein the junction of the first die is proximate the first electrode of the first die.

5. The betavoltaic power converter of claim 1, wherein the junction of the first die is within about 5 microns of the first electrode of the first die.

6. The betavoltaic power converter of claim 1, wherein the junction of the second die is proximate the first electrode of the second die.

7. The betavoltaic power converter of claim 1, wherein the junction of the second die is within about 5 microns of the first electrode of the second die.

8. The betavoltaic power converter of claim 1, wherein the second electrode of the first die comprises a nuclear radiation-emitting radioisotope.

9. The betavoltaic power converter of claim 8, wherein the nuclear radiation-emitting radioisotope of the second electrode of the first die comprises at least one of nickel-63, promethium-147, or scandium tritide.

10. The betavoltaic power converter of claim 8, wherein the junction of the first die is within about 5 microns of the second electrode of the first die.

11. The betavoltaic power converter of claim 1, wherein the second electrode of the second die comprises a nuclear radiation-emitting radioisotope.

12. The betavoltaic power converter of claim 11, wherein the nuclear radiation-emitting radioisotope of the second electrode of the second die comprises at least one of nickel-63, promethium-147, or scandium tritide.

13. The betavoltaic power converter of claim 11, wherein the junction of the second die is within about 5 microns of the second electrode of the second die.

14. The betavoltaic power converter of claim 1, wherein the junction of the first die comprises a P-N junction within the semiconductor substrate of the first die, wherein the semiconductor substrate of the first die comprises a p type region on one of the first side of the P-N junction or the second side of the P-N junction and an n type region on the other of the first side of the P-N junction and the second side of the P-N junction.

15. The betavoltaic power converter of claim 14, wherein the n type region of the first die is an n− semiconductor layer epitaxially grown on an n+ semiconductor layer, the p type region of the first die is a p− semiconductor layer epitaxially grown on the n− semiconductor layer, the first die further comprising a p+ semiconductor layer epitaxially grown on the p− semiconductor layer.

16. The betavoltaic power converter of claim 15, wherein the first electrode of the first die is deposited on and is electrically connected to the p+ semiconductor layer on a side opposite the p− semiconductor layer, and the second electrode of the first die is deposited on and is electrically connected to the n+ semiconductor layer on a side opposite the n− semiconductor layer.

17. The betavoltaic power converter of claim 15, wherein the first die further comprises a trench through the p+ semiconductor layer, the p− semiconductor layer, and the n− semiconductor layer exposing a portion of the n+ semiconductor layer, wherein the first electrode of the first die is deposited on and electrically connected to a first portion of the p+ semiconductor layer on a side opposite the p− semiconductor layer, the second electrode is deposited on a second portion of the p+ semiconductor layer and is electrically connected to the n+ semiconductor layer via an electrical conductor passing through the trench.

18. The betavoltaic power converter of claim 14, wherein the p type region of the first die is an p− semiconductor layer epitaxially grown on a p+ semiconductor layer, the n type region of the first die is a n− semiconductor layer epitaxially grown on the p− semiconductor layer, the first die further comprising a n+ semiconductor layer epitaxially grown on the n− semiconductor layer.

19. The betavoltaic power converter of claim 18, wherein the first electrode of the first die is deposited on and is electrically connected to the n+ semiconductor layer on a side opposite the n− semiconductor layer, and the second electrode of the first die is deposited on and is electrically connected to the p+ semiconductor layer on a side opposite the p− semiconductor layer.

20. The betavoltaic power converter of claim 18, wherein the first die further comprises a trench through the n+ semiconductor layer, the n− semiconductor layer, and the p− semiconductor layer exposing a portion of the p+ semiconductor layer, wherein the first electrode of the first die is deposited on and electrically connected to a first portion of the n+ semiconductor layer on a side opposite the n− semiconductor layer, the second electrode is deposited on a second portion of the n+ semiconductor layer and is electrically connected to the p+ semiconductor layer via an electrical conductor passing through the trench.

21. The betavoltaic power converter of claim 1, wherein the junction of the second die comprises a P-N junction within the semiconductor substrate of the second die, wherein the semiconductor substrate of the second die comprises a p type region on one of the first side of the P-N junction or the second side of the P-N junction and an n type region on the other of the first side of the P-N junction and the second side of the P-N junction.

22. The betavoltaic power converter of claim 21, wherein the n type region of the second die is an n− semiconductor layer epitaxially grown on a n+ semiconductor layer, the p type region of the second die is a p− semiconductor layer epitaxially grown on the n− semiconductor layer, the second die further comprising a p+ semiconductor layer epitaxially grown on the p− semiconductor layer.

23. The betavoltaic power converter of claim 22, wherein the first electrode of the second die is deposited on and is electrically connected to the p+ semiconductor layer on a side opposite the p− semiconductor layer, and the second electrode of the second die is deposited on and is electrically connected to the n+ semiconductor layer on a side opposite the n− semiconductor layer.

24. The betavoltaic power converter of claim 22, wherein the second die further comprises a trench through the p+ semiconductor layer, the p− semiconductor layer, and the n− semiconductor layer exposing a portion of the n+ semiconductor layer, wherein the first electrode of the second die is deposited on and electrically connected to a first portion of the p+ semiconductor layer on a side opposite the p− semiconductor layer, the second electrode is deposited on a second portion of the p+ semiconductor layer and is electrically connected to the n+ semiconductor layer via an electrical conductor passing through the trench.

25. The betavoltaic power converter of claim 21, wherein the p type region of the second die is a p− semiconductor layer epitaxially grown on a p+ semiconductor layer, the n type region of the second die is a n− semiconductor layer epitaxially grown on the p− semiconductor layer, the second die further comprising a n+ semiconductor layer epitaxially grown on the n− semiconductor layer.

26. The betavoltaic power converter of claim 25, wherein the first electrode of the second die is deposited on and is electrically connected to the n+ semiconductor layer on a side opposite the n− semiconductor layer, and the second electrode of the second die is deposited on and is electrically connected to the p+ semiconductor layer on a side opposite the p− semiconductor layer.

27. The betavoltaic power converter of claim 25, wherein the second die further comprises a trench through the n+ semiconductor layer, the n− semiconductor layer, and the p− semiconductor layer exposing a portion of the p+ semiconductor substrate layer, wherein the first electrode of the second die is deposited on and electrically connected to a first portion of the n+ semiconductor layer on a side opposite the n− semiconductor layer, the second electrode is deposited over a second portion of the n+ semiconductor layer and is electrically connected to the p+ semiconductor layer via an electrical conductor passing through the trench.

28. The betavoltaic power converter of claim 1, wherein the bond is formed between the second electrode of the first die and the second electrode of the second die.

29. The betavoltaic power converter of claim 28, wherein the junction of the first die is a P-N junction, the first side of the junction of the first die is a P side of the P-N junction of the first die and the second side of the junction of the first die is an N side of the P-N junction of the first die, wherein the junction of the second die is a P-N junction, the first side of the junction of the second die is a P side of the P-N junction of the second die and the second side of the junction of the second die is an N side of the P-N junction of the second die.

30. The betavoltaic power converter of claim 28, wherein the junction of the first die is a P-N junction, the first side of the junction of the first die is an N side of the P-N junction of the first die and the second side of the junction of the first die is a P side of the P-N junction of the first die, wherein the junction of the second die is a P-N junction, the first side of the junction of the second die is an N side of the P-N junction of the second die and the second side of the junction of the second die is a P side of the P-N junction of the second die.

31. The betavoltaic power converter of claim 1, wherein the bond is formed between the second electrode of the first die and the first electrode of the second die.

32. The betavoltaic power converter of claim 31, wherein the junction of the first die is a P-N junction, the first side of the junction of the first die is a P side of the P-N junction of the first die and the second side of the junction of the first die is an N side of the P-N junction of the first die, and wherein the junction of the second die is a P-N junction, the first side of the junction of the second die is a P side of the P-N junction of the second die and the second side of the junction of the second die is an N side of the P-N junction of the second die.

33. The betavoltaic power converter of claim 31, wherein the junction of the first die is a P-N junction, the first side of the junction of the first die is an N side of the P-N junction of the first die and the second side of the junction of the first die is a P side of the P-N junction of the first die, wherein the junction of the second die is a P-N junction, the first side of the junction of the second die is an N side of the P-N junction of the second die and the second side of the junction of the second die is a P side of the P-N junction of the second die.

34. The betavoltaic power converter of claim 1, wherein the bond is a diffusion bond between the bonded electrodes.

35. The betavoltaic power converter of claim 1, further comprising:
   a third die comprising
      a semiconductor substrate comprising a junction for converting nuclear radiation particles to electrical energy, the junction of the third die comprising a first side and a second side;
      a first electrode comprising a nuclear radiation-emitting radioisotope deposited on the semiconductor substrate of the third die, the first electrode of the third die being electrically connected to the first side of the junction of the third die;
      a second electrode deposited on semiconductor substrate of the third die, the second electrode of the third die being electrically connected to the second side of the junction of the third die; and
   a second bond between one of the first electrode or the second electrode of the third die and one of the unbonded electrode of the first die or the unbonded electrode of the second die.

36. The betavoltaic power converter of claim 1, wherein the bonded first die and the second die form a first stack, the betavoltaic power converter further comprising:
   a second stack comprising:
      a third die comprising:
         a semiconductor substrate comprising a junction for converting nuclear radiation particles to electrical energy, the junction of the third die comprising a first side and a second side;
         a first electrode comprising a nuclear radiation-emitting radioisotope deposited on the semiconductor substrate of the third die, the first electrode of the third die being electrically connected to the first side of the junction of the third die; and
         a second electrode deposited on semiconductor substrate of the third die, the second electrode of the third die being electrically connected to the second side of the junction of the third die;
      a fourth die comprising:
         a semiconductor substrate comprising a junction for converting nuclear radiation particles to electrical energy, the junction of the fourth die comprising a first side and a second side;
         a first electrode comprising a nuclear radiation-emitting radioisotope deposited on the semiconductor substrate of the fourth die, the first electrode of the fourth die being electrically connected to the first side of the junction of the fourth die; and
         a second electrode deposited on the semiconductor substrate of the fourth die, the second electrode of the fourth die being electrically connected to the second side of the junction of the fourth die;
      a second bond between one of the first electrode or the second electrode of the third die and one of the first electrode or the second electrode of the fourth die, wherein the second bond forms an electrical contact between the bonded electrodes of the third die and the fourth die; and
   a third bond between one of the unbonded electrodes of the first die or the unbonded electrode of the second die and one of the unbonded electrodes of the third die and the unbonded electrode of the fourth die.

37. The betavoltaic power converter of claim 36, wherein the third bond forms an electrical contact between the electrodes bonded by the third bond.

* * * * *